(12) United States Patent
Agrawal et al.

(10) Patent No.: US 10,333,045 B2
(45) Date of Patent: Jun. 25, 2019

(54) SOLUTION BASED SYNTHESIS OF COPPER-ARSENIC-CHALCOGEN DERIVED NANOPARTICLES

(71) Applicants: Rakesh Agrawal, West Lafayette, IN (US); Bryan William Boudouris, Lafayette, IN (US); Robert B. Balow, Alexandria, VA (US)

(72) Inventors: Rakesh Agrawal, West Lafayette, IN (US); Bryan William Boudouris, Lafayette, IN (US); Robert B. Balow, Alexandria, VA (US)

(73) Assignee: Purdue Research Foundation, West Lafayette, IN (US)

( * ) Notice: Subject to any disclaimer, the term of this patent is extended or adjusted under 35 U.S.C. 154(b) by 269 days.

(21) Appl. No.: 15/253,119

(22) Filed: Aug. 31, 2016

(65) Prior Publication Data

US 2017/0236989 A1    Aug. 17, 2017

Related U.S. Application Data

(60) Provisional application No. 62/213,011, filed on Sep. 1, 2015.

(51) Int. Cl.
| | | |
|---|---|---|
| *C09D 11/52* | (2014.01) |
| *H01L 35/16* | (2006.01) |
| *H01L 35/18* | (2006.01) |
| *H01L 35/22* | (2006.01) |
| *H01L 35/26* | (2006.01) |
| *H01L 35/34* | (2006.01) |
| *C09D 11/037* | (2014.01) |
| *C09D 11/322* | (2014.01) |

(52) U.S. Cl.
CPC ............ *H01L 35/16* (2013.01); *C09D 11/037* (2013.01); *C09D 11/322* (2013.01); *C09D 11/52* (2013.01); *H01L 35/18* (2013.01); *H01L 35/22* (2013.01); *H01L 35/26* (2013.01); *H01L 35/34* (2013.01)

(58) Field of Classification Search
CPC ......... H01L 35/16; H01L 35/18; H01L 35/34; C09D 11/52; C01G 3/006; C01G 28/002
See application file for complete search history.

(56) References Cited

U.S. PATENT DOCUMENTS

2006/0222592 A1* 10/2006 Burda .................. H01L 31/032
424/9.6

* cited by examiner

*Primary Examiner* — C Melissa Koslow
(74) *Attorney, Agent, or Firm* — C. John Brannon; Brannon Sowers & Cracraft PC

(57) ABSTRACT

A method for obtaining copper arsenic chalcogen derived nanoparticles, including selecting a first precursor material from the group comprising copper, arsenic, antimony, bismuth, and mixtures thereof, selecting a second material from the group comprising sulfur, selenium, tellurium, and mixtures thereof, and then reacting both precursors in a solvent medium at conditions conducive to the formation of copper arsenic chalcogen derived nanoparticles.

9 Claims, 26 Drawing Sheets

| Desired Composition | Atomic Fraction Normalized to Pnictogen Content | | |
|---|---|---|---|
| | $X_1 = \dfrac{Cu}{(As + Sb)}$ | $X_2 = \dfrac{S}{(Cu + As + Sb)}$ | $\dfrac{As}{(As + Sb)}$ |
| $Cu_3AsS_4$ | $2.64 \pm 0.06$ | $1.19 \pm 0.01$ | 1 |
| $Cu_3(As_{0.75}Sb_{0.25})S_4$ | $3.32 \pm 0.23$ | $0.99 \pm 0.03$ | $0.73 \pm 0.02$ |
| $Cu_3(As_{0.50}Sb_{0.50})S_4$ | $2.91 \pm 0.05$ | $1.21 \pm 0.06$ | $0.50 \pm 0.01$ |
| $Cu_3(As_{0.25}Sb_{0.75})S_4$ | $2.92 \pm 0.08$ | $0.98 \pm 0.00$ | $0.26 \pm 0.01$ |
| $Cu_3SbS_4$ | $2.66 \pm 0.01$ | $1.07 \pm 0.01$ | 0 |

FIG. 5

| Desired Composition | Atomic Fraction | | |
|---|---|---|---|
| | $X_1 = \dfrac{Cu}{(As + Sb)}$ | $X_2 = \dfrac{Se}{(Cu + As + Sb)}$ | $\dfrac{As}{(As + Sb)}$ |
| $Cu_3AsSe_4$ | 2.98 ± 0.08 | 1.06 ± 0.01 | 1 |
| $Cu_3(As_{0.75}Sb_{0.25})Se_4$ | 3.16 ± 0.10 | 1.08 ± 0.01 | 0.72 ± 0.07 |
| $Cu_3(As_{0.50}Sb_{0.50})Se_4$ | 2.52 ± 0.20 | 1.15 ± 0.02 | 0.51 ± 0.03 |
| $Cu_3(As_{0.25}Sb_{0.75})Se_4$ | 2.81 ± 0.02 | 1.13 ± 0.00 | 0.27 ± 0.08 |
| $Cu_3SbSe_4$ | 2.78 ± 0.04 | 1.14 ± 0.01 | 0 |

FIG. 12

| Target Composition | Atomic Fraction | | | |
|---|---|---|---|---|
| Desired Composition | $X_1 = \dfrac{Cu}{(As+Sb)}$ | $X_2 = \dfrac{(S+Se)}{(Cu+As+Sb)}$ | $\dfrac{As}{(As+Sb)}$ | $\dfrac{S}{Se}$ |
| $Cu_3(As_{0.50}Sb_{0.50})Se_4$ | $2.94 \pm 0.03$ | $1.04 \pm 0.01$ | $1.06 \pm 0.01$ | $0.42 \pm 0.00$ |

FIG. 18

| Post Annealing (Se) | Atomic Fraction | | |
|---|---|---|---|
| Desired Composition | $X_1 = \dfrac{Cu}{(As + Sb)}$ | $X_2 = \dfrac{Se}{(Cu + As + Sb)}$ | $X_3 = \dfrac{As}{(As + Sb)}$ |
| $Cu_3SbSe_4$ | $2.99 \pm 0.04$ | $1.06 \pm 0.01$ | 0 |
| $Cu_3(As_{0.25}Sb_{0.75})Se_4$ | $2.99 \pm 0.01$ | $1.03 \pm 0.01$ | $0.24 \pm 0.00$ |
| $Cu_3(As_{0.50}Sb_{0.50})Se_4$ | $2.91 \pm 0.04$ | $1.02 \pm 0.01$ | $0.50 \pm 0.02$ |
| $Cu_3(As_{0.75}Sb_{0.25})Se_4$ | $3.31 \pm 0.02$ | $1.06 \pm 0.01$ | $0.71 \pm 0.05$ |
| $Cu_3AsSe_4$ | $3.17 \pm 0.13$ | $1.05 \pm 0.02$ | 1 |

FIG. 23

SOLUTION BASED SYNTHESIS OF COPPER-ARSENIC-CHALCOGEN DERIVED NANOPARTICLES

CROSS-REFERENCE TO RELATED APPLICATIONS

This patent application claims priority to co-pending provisional U.S. patent application Ser.No. 62/213,011, filed on Sep. 1, 2015.

This invention was made with government support under 0903670-DGE awarded by the National Science Foundation and N66001-12-1-4253 awarded by the Defense Advanced Research Projects Agency. The government has certain rights in the invention.

TECHNICAL FIELD

This disclosure generally relates to material science, and, more particularly, to the synthesis and use of nanoparticles comprising copper, arsenic, antimony, bismuth, sulfur, selenium, and tellurium, and in particular to the incorporation of such nanoparticles in thin films useful for electronics, photovoltaics, thermoelectric, solar energy conversion, and like applications.

BACKGROUND

This section introduces aspects that may help facilitate a better understanding of the disclosure. Accordingly, these statements are to be read in this light and are not admissions regarding what is or is not prior art.

Semiconducting nanoparticles (NPs) are useful in such practical applications as electronics, light emitting diodes, sensors, thermoelectrics, solar cells, and the like. By suspending NPs in a solvent, a NP "ink" can be formulated, enabling printing or spray coating of semiconducting compounds and allowing a roll-to-roll manufacturing route and potentially reducing production costs. For example, earth abundant solar absorber materials produced from NP inks offer a low cost and highly scalable route to solar cell production, compared to vacuum processing. Thin film formation via nanoparticle dispersion also enables production of flexible materials and devices.

Nanoparticle based devices offer additional tunability and subsequent performance enhancement through exploitation of the quantum confinement effect (QCE) and relevant chemistry related to high surface area materials. More specifically, thermoelectric device performance such as carrier concentration and thermal conductivity can be optimized via control of the nanocrystal morphology, as this can act as phonon scattering centers. By using a nanoparticle framework, these parameters can be controlled, enabling low cost optimization of thermoelectric properties with highly scalable, solution processable production.

By themselves, NP films do not typically provide high performance due to extremely low carrier transport properties, which are typically circumvented by spark plasma sintering or hot pressing. These sintering methods, while greatly increasing device performance, offer limited scalability of these types of thermoelectric devices.

One material commonly utilizing such sintering methods is the $Cu_3SbSe_4$ system, which is gaining significant recognition as a potential high-performance earth abundant thermoelectric material. A number of strategies have been previously reported to synthesize $Cu_3SbSe_4$ including mechanical alloying, co-precipitation, melting or fusion of elements, among other methods. High device performance has only been demonstrated after hot pressing or spark plasma sintering of the powders or films. The performance of the $Cu_3SbSe_4$ system has been improved by creating solid solutions of the sulfur and selenium materials forming $Cu_3Sb(S,Se)_4$. While some success has also been achieved by doping $Cu_3SbSe_4$ with other elements, such as bismuth or tin, resulting in increased carrier transport and decreased thermal conductivity, for such a material system to be industrially viable, further improvements are needed to increase the thermoelectric device performance, as well as utilize a more scalable synthesis and sintering process. The present novel technology addresses these needs.

SUMMARY

In one aspect, the present disclosure provides a method for synthesizing copper (Cu), arsenic (As) and chalcogen (Ch) derived (CAS) nanoparticles (NPs), as well as a heat treatment process that greatly enhances the electrical properties of the materials. Precursors yielding Cu, P, As, Sb, Bi ions, or combinations thereof, are dissolved or suspended in one or more liquids providing precursor liquid (typically a solution or suspension) A. Other precursors yielding S, Se, Te ions, or combinations thereof, are dissolved or suspended in one or more liquids providing precursor liquid (typically a solution or suspension) B. Precursor liquids A and B may be reacted together, directly or in one or more solvents, under conditions sufficient for forming CAS derived NPs.

The CAS NPs may also be formed by combining individual components comprising Cu, P, As, Sb, Bi and/or chalcogenide/s in a single reaction mixture with one or more solutions providing conditions necessary for the reaction mixture to form NPs. In one embodiment, subsequent addition of one or more solutions including Cu, P, As, Sb, Bi, or a combination thereof and/or chalcogenide/s to CAS NPs providing conditions necessary for the reaction mixture to incorporate the added constituents resulting in multilayer NPs where the various layers may enjoy interlayer and/or intralayer variance of elemental composition, crystal structure and/or phase.

Precursor solution A may include, but is not limited to (1) elemental Cu, P, As, Sb, Bi or combination thereof; (2) alloys of Cu, P, As, Sb, Bi, and/or combinations thereof; (3) salts of Cu, P, As, Sb, Bi, and/or combinations thereof; (4) complexes of Cu, P, As, Sb, Bi, and/or combinations thereof; (5) chalcogenides of Cu, P, As, Sb, Bi, and/or combinations thereof.

Precursor solution B may include, but is not limited to: (1) elemental chalcogens (e.g. S, Se, Te, etc.); (2) chalcogen containing compounds; (3) complexes of S, Se, Te, and/or combinations thereof.

Exemplary solvents include alkanes, alkenes, phosphines, alkane derivatives, alkene derivatives, and combinations thereof, including alkane and alkene derivatives having at least one (but not limited to one) of the following: amine, amide, carboxylic acid, ether, phosphonic acid, thiol, selenol, and/or sulfoxide functional group.

A heating step may also be used to enhance the properties of the NPs by partial or complete removal of ligands, densification of NPs and/or increasing grain size. Heating the NPs may be accomplished in a liquid media, in vacuum, in an inert environment or in a reactive atmosphere. The NPs can be bound or unbound to an underlying substrate. Exemplary heating conditions include, but are not limited to, heating bound NPs in an inert (nitrogen, argon, etc.) atmosphere and/or an atmosphere enjoying chalcogen(s) (S, Se, Te) and/or chalcogen compound(s) ($As_2S_3$, $Cu_2S$, etc.) above, below, or at atmospheric pressure.

Preparation of thin films from precursor solutions can be accomplished by many methods including, but not limited to, coating, dropcasting, tape casting (doctor blading), spin coating, ink-jet printing, spray coating and like techniques wherein NP ink(s) comprising Cu, P, As, Sb, Bi, S, Se, Te, and/or combinations thereof are subjected to conditions suitable for forming NP based thin films.

BRIEF DESCRIPTION OF THE FIGURES

FIG. 5 shows the elemental composition of the $Cu_3(As,Sb)S_4$ CAS derived NPs using scanning electron microscopy energy dispersive X-ray spectroscopy (SEM-EDS).

FIG. 12 shows SEM-EDS elemental analysis of several $Cu_3(As,Sb)Se_4$ NP compositions.

FIG. 18. shows elemental analysis of the $Cu_3(As,Sb)(S,Se)_4$ NPs obtained by SEM-EDS.

FIG. 23 shows SEM-EDS bulk elemental analysis of the CAS derived NPs after annealing in selenium at 340° C. for 30 min showing minimal changes in stoichiometry.

DETAILED DESCRIPTION

Figure 1:
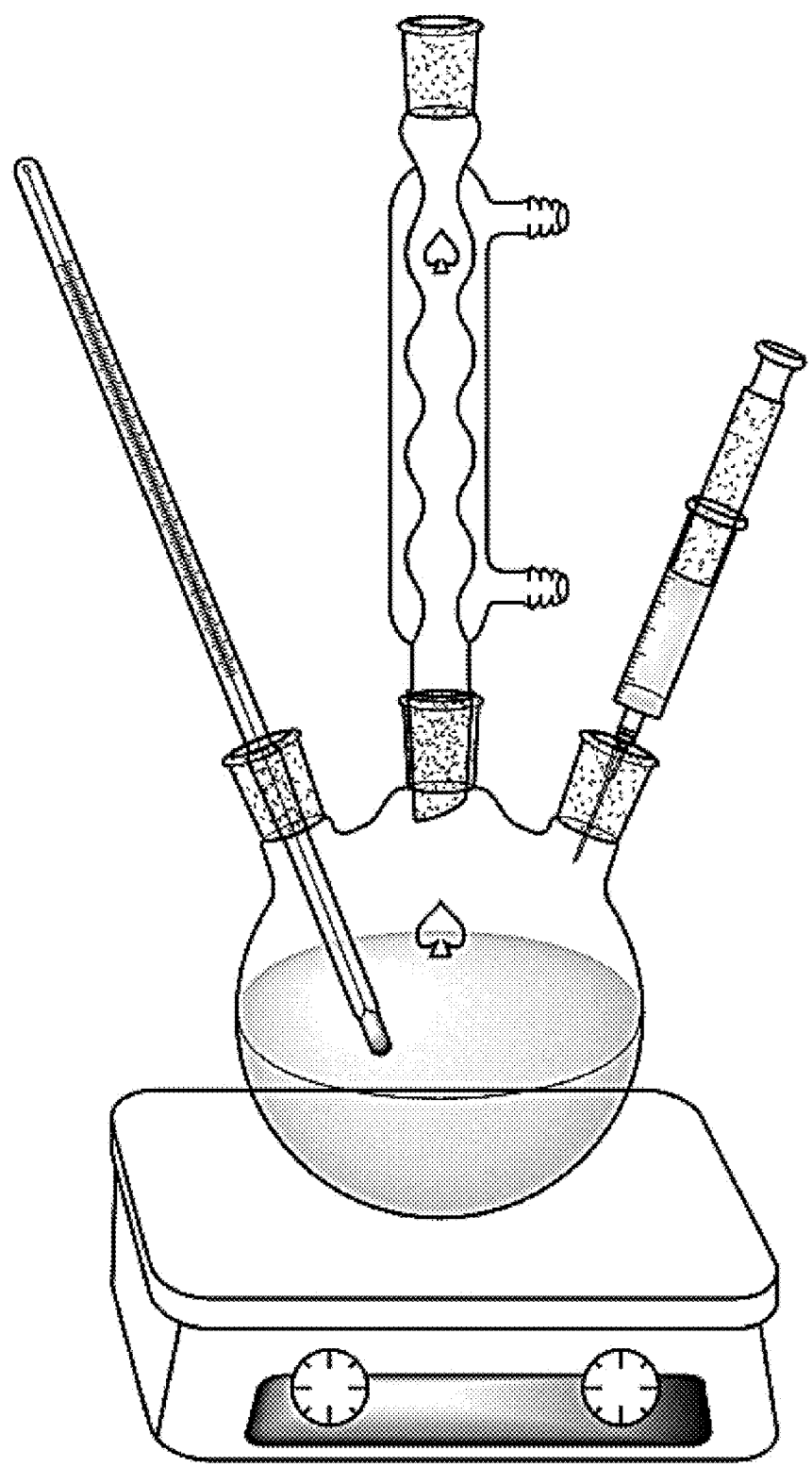
FIG. 1 shows a typical glassware setup used for CAS derived NP synthesis.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

Definitions:

To provide a clear understanding of the specifications and claims, the following definitions are provided.

As used herein, the term chalcogen refers to any group 16 element (e.g. O, S, Se, Te, etc.) or combination thereof.

As used herein, the term pnictogen refers to any group 15 element (e.g. N, P, As, Sb, Bi, etc.) or combination thereof.

As used herein, the term crystallogen refers to any group 14 element (e.g. C, Si, Ge, Sn, Pb, etc.) or combination thereof.

As used herein, the term calcining means to heat to an elevated temperature, such as to reduce, oxidize, desiccate, anneal and/or sinter; the calcination environment may be a reducing atmosphere, an oxidizing atmosphere, or a partial vacuum.

As used herein, the term nanoparticle means a single particle which can have a single characteristic dimension measuring at least, but not limited to 1 to 1000 nm and can be amorphous, crystalline, or polycrystalline.

As used herein, the term copper-arsenic-chalcogen derived (CAS) nanoparticles refers to a nanoparticle comprising at least copper, arsenic and chalcogen. The composition can also include mixtures of pnictogens and chalcogens such as (P,As,Sb,Bi) and (O,S,Se,Te), respectively.

As used herein, the term precursor may be used with reference to an organic or inorganic compound or reactant liquid, such as a solution and/or suspension, used in the nanoparticle synthesis process.

As used herein, the term complex may contain Cu, P, As, Sb, Bi or a combination thereof which may be coordinated to one or more donor atoms. Examples may include, but are not limited to copper acetylacetonate, triphenylphosphine, triphenylarsine, triphenylantimony, and triphenylbismuth.

As used herein, the term chalcogenide refers to compounds containing copper, arsenic, antimony, bismuth or a combination thereof and oxygen, sulfur, selenium, tellurium, or combination thereof. Examples of chalcogenides are, but not limited to, CuO, CuS, CuSe, CuTe, $Cu_2O$, $Cu_2S$, $Cu_2Se$, $Cu_2Te$, $P_2O_3$, $P_2O_5$, $P_2S_3$, $P_2S_5$, $P_2Se_3$, $P_2Se_5$, $P_2Te_3$, $P_2Te_5$, $As_2O_3$, $As_2S_3$, $As_2Se_3$, $As_2Te_3$, $As_2O_5$, $As_2S_5$, $As_2Se_5$, $As_2Te_5$, $Sb_2O_3$, $Sb_2S_3$, $Sb_2Se_3$, $Sb_2Te_3$, $Sb_2O_5$, $Sb_2S_5$, $Sb_2Se_5$, $Sb_2Te_5$, $Bi_2O_3$, $Bi_2O_5$, $Bi_2S_3$, $Bi_2S_5$, $Bi_2Se_3$, $Bi_2Se_5$, $Bi_2Te_5$ and combinations thereof.

As used herein, the term salt refers to acetates, halides (e.g. chlorides, bromides, iodides, etc.), nitrites, nitrates, sulfites, sulfates, acetates, hydroxides, oxyhalides (e.g. BiOCl), or combinations thereof.

As used herein, the term elemental refers to a substance consisting of atoms, all having the same number of protons. Examples include, but are not limited to, Cu, P, As, Sb, Bi, S, Se, and Te.

As used herein, the term alloy can be a combination of elemental forms of Cu, P, As, Sb, Bi at various atomic ratios.

As used herein, the term silyl chalcogen can be a compound where a silicon may be bound to a chalcogen. An example includes, but is not limited to, bis(trimethylsilyl sulfide).

As used herein, the term "CAS" refers to a NP having a molecular formula of $Cu_3(P_w,As_x,Sb_y,Bi_z)(O_s,S_t,Se_u,Te_v)_{4-r}$, where w+x+y+z=1, 0<x<1, 0≤w<1, 0≤y<1, 0≤z<1; s+t+u+v=1 and 0≤s≤1, 0≤t≤1, 0≤u≤1, 0≤v≤1; and −1.25≤r≤1.25. The CAS NPs as defined by the molecular formula always contains some quantity of As and at least one additional pnictogen. For example, when w=0, z=0, s=0, t=0, v=0, and r=0, we get $Cu_3(As_x,Sb_y)Se_4$ NPs. It should be noted the actual composition of the synthesized NPs may be slightly off from $Cu_3(P_w,As_x,Sb_y,Bi_z)(O_s,S_t,Se_u,Te_v)_{4-r}$; i.e. Cu to pnictogen atomic ratio rather than being exactly 3, it may be in the range of 2.1 to 3.8.

As used herein, the term "SIN derived" refers to a subset of CAS derived NPs having a molecular formula of $Cu(P_aAs_bSb_cBi_d)(O_eS_fSe_gTe_h)_{2-k}$, where a+b+c+d=1, 0≤a<1, 0<b<1, 0≤c<1, 0≤d<1; e+f+g+h=1 and 0≤e≤1, 0≤f≤1, 0≤g≤1, 0≤h≤1; and −1.0≤k≤1.0 . The SIN derived NPs as defined by the molecular formula always contains some quantity of As and at least one additional pnictogen. For example, when a=0, d=0, e=0, f=0, h=0, and k=0, we get $Cu(As_xSb_y)Se_4$ NPs. It should be noted the actual composition of the synthesized NPs maybe slightly off from $Cu(P_aAs_bSb_cBi_d)(O_eS_fSe_gTe_h)_{2-k}$; i.e. Cu to pnictogen atomic ratio rather than being exactly 1, it maybe in the range of 0.25 to 1.75.

As used herein, the term "stoichiometric" may be applied to NP composition or precursors used for NP synthesis. Stoichiometric NP composition refers to a relative atomic ratio between the elements of the NP/s. When applied to precursors, it represents the molar ratios of the elements in the precursor. Due to the small size of nanoparticles, defects can influence overall stoichiometry to result in a balanced (or unbalanced) stoichiometry. A balanced stoichiometric formula is one with enough of each element to complete the formed crystal structure having all sites occupied in the lattice. An unbalanced "stoichiometric" formula has a deficiency and/or excess of one or more elements with respect to the other elements. In practice, most NP systems exhibit an unbalanced stoichiometry.

As used herein, the term "organopnictogen" can be any group 15 element of the periodic table of elements with organic substituents. A general formula is $NR_3$ where N is a pnictogen and R is an organic substituent. Examples of organic substituent include, but are not limited to R=$CH_3$, $CH_2-CH_3$, $C_6H_5$, $Si(CH_3)_3$, $Si(OCH_3)_3$, and combinations thereof.

The present novel technology combines NP tunability and phonon scatting performance enhancement ideology with elemental alloying of isostructural materials and scalable, solution-based synthesis to obtain novel hybrid nanocrystal thermoelectric materials comprising a solid solution (alloys) of copper, arsenic, chalcogen and various other elements. This novel material class enables significant tuning to further enhance the thermoelectric properties, such as through improvements in the Seebeck coefficient and conductivity after an annealing process in a chalcogen atmosphere. The annealing compacts and gently sinters the NPs together, greatly increasing conductivity while maintaining a nanostructured porous material suitable for reducing thermal conductivity through phonon scattering. Furthermore, this annealing is easily integrated into roll-to-roll type processing equipment enabling a scalable route to high efficiency, low-temperature, earth-abundant thermoelectrics.

These copper-arsenic-chalcogen (CAS) derived alloy NPs can also be used for optoelectronic devices, sensors, and solar cells. The band gap energy and other physical and electrical properties can easily be tuned depending on the relative amount of the elements comprising the solid solutions, providing a convenient material system for these devices and sensors.

The crystal structure for these CAS derived NPs can exist in many morphologies, such as monoclinic, triclinic, orthorhombic, hexagonal, cubic and tetragonal. Also, the relative elemental ratios of the components of the solid solution NPs can vary. Some examples include: $Cu_3(P,As,Sb,Bi)(O,S,Se,Te)_3$, $Cu_{12}(P,As,Sb,Bi)_4(O,S,Se,Te)_{13}$, and $Cu_3(P,As,Sb,Bi)(O,S,Se,Te)_4$. Additionally the same family of compounds can have other elemental ratios such as $Cu(P,As,Sb,Bi)(O,S,Se,Te)_2$.

Synthesis of CAS derived NPs:

The present invention provides methods for synthesizing CAS derived NPs comprising Cu, P, As, Sb, Bi, S, Se, and/or Te. More specifically, synthesis under these conditions can form individual CAS derived NPs having a general molecular formula denoted by:

$Cu_3(P_w,As_x,Sb_y,Bi_z)(O_s,S_t,Se_u,Te_v)_{4-r}$, where w+x+y+z=1, 0<x<1, 0≤W<1, 0≤y<1, 0≤z<1; s+t+u+v=1 and 0≤s≤1, 0≤t≤1, 0≤u≤1, 0≤v≤1; and −1.25≤r≤1.25. In addition, compositions where w+x+y+z=1; 0≤x≤1; and when x=0, at least two of the w, y, and z are nonzero are also acceptable.

The CAS derived NPs may be characterized by the following atomic ratios:

$$\frac{Cu}{(P+As+Sb+Bi)} = X_1; \text{ and } \frac{(O+S+Se+Te)}{(Cu+P+As+Sb+Bi)} = X_2.$$

In one embodiment, the present invention provides stoichiometric CAS derived NPs where $X_1$ is 3 and $X_2$ is 1.

The present invention can provide non-stoichiometric CAS derived NPs. Non-stoichiometric CAS derived NPs may contain molar ratios of one or more elements deficient and/or in excess relative to stoichiometric CAS derived NPs. Therefore, non-stoichiometric CAS derived NPs may be Cu rich, Cu poor, pnictogen rich, pnictogen poor, chalcogen rich, or chalcogen poor. For Cu rich, $X_1>3$; for Cu poor, $X_1<3$; for pnictogen rich, $X_1<3$; for pnictogen poor, $X_1>3$; in chalcogen rich, $X_2>1$; in chalcogen poor, $X_2 \geq 1$. Generally, $2.1 \leq X_1 \leq 3.8$ and $0.6 \leq X_2 \leq 1.32$.

In one embodiment, CAS derived NPs are synthesized by reacting a first group of precursors (precursor solution A) with a second group of chalcogen containing precursor/s (precursor solution B) in one or more compatible solvents under conditions favorably forming CAS derived NPs. The reaction can be initiated from about room temperature to about 365° C., typically between 100° C. to 225° C.

Precursor solution A may include Cu, P, As, Sb, and/or Bi yielding compounds. Examples of Cu, P, As, Sb, and Bi containing compounds are, but not limited to (1) elemental forms of Cu, P, As, Sb and Bi; (2) alloys yielding Cu, P, As, Sb, Bi, such as, but not limited to, $Cu_3P$, $Cu_2P$, $CuP_2$, $Cu_3As$, $Cu_2As$, $CuAs_2$, $Cu_3Sb$, $Cu_2Sb$, $CuSb_2$, $CuBi$, $Cu(P,As,Sb)_3$, $Cu_2(P,As,Sb)$, $Cu(P,As,Sb)_2$; (3) salts of Cu, P, As, Sb, Bi including halides such as copper chloride, phosphorous trichloride, arsenic trichloride, antimony trichloride, bismuth trichloride, phosphites, such as sodium phosphite, phosphates, such as potassium phosphate, arsenites, such as sodium arsenite, arsenates, such as potassium arsenate; antimonites, such as sodium antimonite, antimonates, such potassium antimonate, bismuthates, such as sodium bismuthate; (4) oxyhalides, including, but not limited to, $POCl_3$, $BiOCl$, $SbOCl$, $AsOCl$; (5) complexes of copper, phosphorous, arsenic, antimony, and/or bismuth such as copper acetylacetonate, triphenylarsine, triphyenylstibine; (6) chalcogenides of Cu, P, As, Sb, and/or Bi such as oxides, sulfides, selenides and tellurides, including but not limited to CuO, CuS, CuSe, CuTe, $Cu_2O$, $Cu_2S$, $Cu_2Se$, $Cu_2Te$, $P_2O_3$, $P_2O_5$, $P_2S_3$, $P_2S_5$, $P_2Se_3$, $P_2Se_5$, $P_2Te_3$, $P_2Te_5$, $As_2O_3$, $As_2S_3$, $As_2Se_3$, $As_2Te_3$, $As_2O_5$, $As_2S_5$, $As_2Se_5$, $As_2Te_5$, $Sb_2O_3$, $Sb_2S_3$, $Sb_2Te_3$, $Sb_2O_5$, $Sb_2S_5$, $Sb_2Te_5$, $Bi_2O_3$, $Bi_2O_5$, $Bi_2Se_3$, $Bi_2Se_5$, $Bi_2Te_3$, $Bi_2Te_5$, as well as ternary and quaternary compounds and mixtures thereof; (7) organopnictogens such as phosphine, arsine, stibine, bismuthine, (8) and combinations thereof. Note that since CAS NPs always contain As, precursor solution A will always contain As.

The second group of precursors may include (1) elemental chalcogen (e.g. S, Se, Te, etc.) in, but not limited to, powder, flake, pellet, bead, bulk, or vapor form; (2) chalcogen compounds, including but not limited to $H_2S$, $H_2Se$, $H_2Te$, $Na_2S$, $Na_2Se$, $Na_2Te$, diethyl selenium, urea, thiourea, selenourea, thiols (e.g. dodecanethiol), selenols (e.g. dodecaneselenol), and/or gaseous derivatives thereof; (3) chalcogenides; (4) chalcogen complexes, including but not limited to oleylamine-sulfur complex, oleylamine-selenium complex, oleylamine-tellurium complex, trioctylphosphine-sulfur complex, and trioctylphosphine-selenium complex, trioctylphosphine-tellurium complex; octadecene-sulfur complex, octadecene-selenium complex, octadecene-tellurium complex, (5) amine and/or thiol complexes, amine and/or thiol complex of sulfur, selenium, and/or tellurium; amine and/or thiol complexes include diamines and dithiols; (6) silyl chalcogens, including but not limited to bis(trimethylsilyl sulfide); or a mixture thereof. Precursor solutions A and B may be dissolved or suspended in one or more compatible solvents to form respective precursor solutions. In addition, both groups of precursors may be suspended in a solvent or solvent mixture to form a single precursor solution. Exemplary solvents include alkanes, alkenes, alkane derivatives, alkene derivatives, and combinations thereof, including alkane and alkene derivatives having at least, but not limited to, one amine, amide, carbonate, carboxylic acid, ether, phosphine, phosphine oxide, phosphonic acid, thiol, or sulfoxide functional group. Furthermore, non-coordinating solvents (e.g. alkanes and alkenes) may be combined with coordinating ligands with one or more functional groups such as, but not limited to amines, amides, carbonates, carboxylic acids, ethers, phosphines, phosphine oxides, phosphonic acids, thiols and sulfoxides.

In one preferred embodiment, the first group of precursors may be suspended in one or more solvent(s) providing precursor solution A and the second group of precursors may be suspended in one or more solvent(s) providing precursor solution B, whereby the precursor solutions A and B are combined to form a reaction mixture, which can be heated to a sufficient temperature (preferably from about 50° C. to about 225° C.) under conditions suitable for forming CAS NPs. The first group of precursors may also be suspended in one or more solvent(s) separately and subsequently combined to provide precursor solution A. NPs may be collected by centrifugation following the reaction of precursor solutions A and B.

The size, elemental composition, and stoichiometric properties of the CAS derived NPs may be influenced or controlled by varying the Cu, P, As, Sb, and Bi containing precursors, the chalcogen precursor, solvents, and synthesis conditions, as further described herein.

In one embodiment, the precursors containing Cu, P, As, Sb and Bi are dissolved or suspended in one or more compatible solvents in the reaction vessel. The solution is typically purged and refilled with argon or other inert gas several times, at which point the temperature is controlled to between 100° C. and 411° C., whereupon the chalcogen precursor solution B is added to the reaction vessel. The reaction mixture proceeds to completion then is cooled to below 40° C.

In one embodiment, CAS derived NPs with a monoclinic, triclinic, hexagonal, orthorhombic and/or cubic crystal structure representative of $Cu_3AsS_3/Cu_{12}As_4S_{13}$ or $CuAsS_2$ compounds may typically be synthesized between about 100° C. and 411° C., more typically between about 250° C. and about 411° C.

The NPs are collected, such as by centrifugation with a suitable solvent/antisolvent or mixture thereof, such as 5:1 mixture of ethanol and hexane, and are typically washed, more typically washed at least three times.

A NP precipitate may be redispersed in a suitable solvent, such as toluene, forming a stable NP ink solution.

In an exemplary CAS derived NP synthesis, precursors containing Cu, P, As, Sb and Bi are suspended in one or more compatible solvents (precursor solution A), which is heated to between about 50° C. and about 100° C. with stirring for several hours. A second group of chalcogen precursors containing O, S, Se, Te, or a combination thereof (precursor solution B), is heated to between 20° C. and about 100° C. with stirring. A reaction vessel containing a compatible solvent or mixture of solvents, is purged and refilled with argon several times at which point, the temperature is adjusted to between about 100° C. to about 411° C., whereupon the chalcogen precursor solution B is added to the reaction vessel. After a short while, typically about 20 seconds, precursor solution A is added to the reaction vessel forming the reaction mixture. The reaction mixture proceeds to completion, and then the reaction mixture is cooled to below 40° C. and collected. The CAS derived NPs is typically washed with a solution, such as a cleaning bath containing about a 5:1 ethanol:hexane, typically with centrifugation at about 14,000 rpm for 5 min.

The selenide, telluride and mixed chalcogenide based CAS derived NPs follows a very similar synthesis as the above synthesis of sulfide based CAS derived NPs, with the difference being injection of the chalcogen precursor can be performed at temperatures greater than 175° C. Also, the preferred reaction temperature is between about 200° C. and about 411° C. for about 30 min.

Thin Film Coatings:

The present invention focusses on two aspects: (1) thin film compositions and coating methods employing the use of CAS derived NPs or ink solutions or suspensions thereof as described herein; and (2), calcining thin films in chalcogen environment to improve its performance. In one thin film coating embodiment, a method for forming a thin film involves depositing a layer of any of the CAS derived particles described herein, and then calcining the layer of the particles to yield a thin film. The layer of CAS derived NPs may typically be deposited on a substrate in the form of a nanoparticle ink solution. The CAS derived NP layer may be of uniform composition or it may comprise a mixed composition of particles, including CAS derived NPs with different compositions and/or stoichiometries, pnictogen, chalcogen, and/or copper containing compounds (solid, liquid or gas) as further described below. While the typical thickness of the deposit CAS derived NP layer is less than 100 micrometers, the process of current invention is also applicable to thicker films.

In another thin film coating embodiment, thin film compositions may be formed from one or more particle layers forming a thin film having a distinct composition profile. In one embodiment, CAS derived NPs are deposited on the substrate to form a first layer of particles and a second plurality of particles may be deposited on the substrate to form a second layer of particles, where the first and second layers of particles are annealed to form an alloy film having a composition profile, and where at least one of the first layer, second layer, or both comprises a plurality of CAS derived particles.

Either of the above thin film coating methodologies may involve deposition of CAS derived NPs directly on the substrate or they may involve direct deposition of CAS derived NPs onto another layer of particles. At least one of the first layer, second layer, or both may be deposited on the substrate from one or more ink solutions as described above. In a preferred embodiment, each layer of particles is deposited from a corresponding ink solution. Accordingly, the first layer may be deposited on the substrate from a first ink solution, and at least a second layer may be deposited on the substrate from a second ink solution.

The CAS derived films may be deposited as a composition or ink solution of uniform composition or it may be deposited as a mixed composition of particles, including a plurality of a CAS derived NPs and a plurality of a second particle as further described below. Ink solutions containing CAS derived NPs can be applied directly to desired substrates or other particle layers using various methods known to those skilled in the art, such as drop casting, spray coating, inkjet printing, roll coating, knife coating, spin coating, dip coating, web coating, and the like (and combinations thereof). Exemplary substrates included but not limited to glass, metal, plastic, glass coated with metal, plastic coated with metal, and combinations thereof. The substrate may be configured in various shapes known to those skilled in the art, including as a sheet, such as a foil sheet, cylinder, or the like.

A single coating layer of particles may have thickness ranging from between about 2 nm to about 50 µm. The total thickness of the overall single-layer or multi-layer precursor coating(s) may range from about 4 nm to about 500 µm, preferably from about 500 nm to about 5 µm. After depositing any (or all) particle layer(s), the particle layer may be subjected to chemical treatment, annealing, calcining, sintering, etching, washing, or combination thereof. The heat treatment step (annealing, calcining, and/or sintering) may be performed under a desired atmosphere of choice, including vacuum, inert, reducing, or oxidizing atmosphere to remove, for example, organic and inorganic additives used during the formulation of the ink solution used for the particle layer (this heat treatment or calcining step is to be distinguished from the calcining step performed in the presence of chalcogen source described below). A washing step may be similarly used after depositing any (or all) particle layer(s) to remove the organic and inorganic additives used during the formulation of the ink. In addition, solutions containing solvents or etchants may be used after depositing any (or all) particle layer(s) for the selective removal of certain additives used when formulating an ink associated therewith. Such methods may include, for example, the use of a Soxhlet extractor, as well as other techniques and apparatuses known to those skilled in the art.

By way of example, an ink solution containing CAS derived NPs may be drop cast on a substrate, such as glass, successively as independent layers, whereby each of two successively deposited layers is separately annealed in an inert atmosphere, such as argon, at about 200° C. for 1 min.

In a chalcogen annealing or sintering embodiment, a method for forming a thin film comprises depositing a layer of any of the CAS derived particles described herein, providing a source of one or more chalcogen containing compounds and annealing or sintering the layer of the particles in the presence of at least one chalcogen to form a CAS derived thin film. In this case, the annealing or sintering step is performed in a chalcogen atmosphere at an elevated temperature to promote film performance. The annealing or sintering temperature is typically from about 150° C. to about 650° C., and more typically between 250° C. and 650° C. The chalcogens are typically O, S, Se, and/or Te and are typically provided in elemental form or in a form that can donate the needed chalcogen. The actual heat treatment temperature will depend on the particular chalcogen chosen, the CAS system used, and the physical parameters (thicknesses, mean particle size, PSD, NP concentration, and the like) of the film.

A chalcogen exchange step can be used to form pure (single chalcogen) or mixed chalcogen (O,S,Se,Te) CAS derived NPs or thin films. By way of example, pure $Cu_3(As,Sb)Se_4$ or mixed $[Cu_3(As,Sb)(S,Se)_4]$ NPs or thin films may be synthesized from $Cu_3(As,Sb)S_4$ or other CAS derived NPs or thin films by providing conditions suitable for partial exchange of one or more chalcogen(s) in the NPs or thin film. This may be achieved by providing a suitable environment (or atmosphere) and/or a source of chalcogen precursors.

In a further embodiment, as described above, an annealing or calcining step may be performed in a chalcogen atmosphere at an elevated temperature to promote chalcogen exchange when coating a substrate with one or more layers of particles, including at least one layer comprising a plurality of chalcogens, including CAS derived NPs and thin films according to the present invention.

The incorporation of a chalcogen exchange step can be used to form $Cu_3(As,Sb)(O,S,Se,Te)_4$, thin films. By way of example, CAS derived thin films may be synthesized from CAS derived NPs by providing conditions suitable for the partial or complete exchange of the chalcogen in the NPs with one or more chalcogen containing compounds, so as to partially or completely exchange the chalcogen bound to the NPs with chalcogen in a surrounding atmosphere during calcining or annealing. This may be achieved by providing a suitable environment (or atmosphere) with a source of O,S,Se, and/or Te precursors. CAS derived thin films may be formed by providing conditions suitable for full exchange of the original chalcogen contained in the CAS derived NP or thin films by one or more second or new chalcogen containing compounds in the CAS derived layers, such that the second chalcogen becomes the prevalent or only chalcogen in the CAS derived NPs or thin film. Thus, $Cu_3(As,Sb)Se_4$ NPs can be synthesized by fully replacing all sulfurs in the $Cu_3(As,Sb)S_4$ NP layer(s). Mixed chalcogenides of the CAS derived NPs or thin films such as $Cu_3(As,Sb,Bi)(O,S,Se,Te)_4$ can also be synthesized via the chalcogen exchange in a the presence of one or more chalcogen containing compounds (or atmospheres) at conditions suitable for exchanging chalcogen.

A chalcogen exchange step may be performed either in a gas phase or liquid phase reaction. Further, the temperature for chalcogen exchange may typically range between about 50° C. to about 650° C. For gas phase reactions, the temperature for chalcogen exchange may typically range between about 250° C. and about 650° C., more typically between about 250° C. and about 450° C. For liquid phase reactions, the temperature for chalcogen exchange may typically range between about 50° C. to about 400° C., more typically between about 150° C. and about 400° C., and still more typically between about 200° C. and about 350° C.

The degree of chalcogen exchange may be controlled by varying the reaction conditions, particularly temperature, time, and concentration(s) of chalcogen reactants. The degree of chalcogen exchange is typically measured or expressed as the ratio of the different chalcogens before and after exchange reaction, which could be anything greater than or equal to 0. Use of a higher temperature or increased time of exchange or increased chalcogen concentration may more rapidly exchange and/or exchange greater amounts of chalcogen.

In another chalcogen heat treatment embodiment, a chalcogen atmosphere is used to stabilize the CAS derived NPs and thin films and enhance grain growth and/or densification at elevated temperatures. For example, $Cu_3(As,Sb)Se_4$ NPs or thin films can be annealed in a chalcogen atmosphere (preferably selenium) at temperatures between 150-650° C., preferably between about 250 and 375° C. resulting in significant necking between particles and/or grain growth of the CAS derived NPs while maintaining phase purity of the NPs or thin films. Other CAS derived NPs or NP thin films containing one or more chalcogens may be stabilized at higher temperatures by an atmosphere comprising one or more chalcogens.

Doping CAS derived NPs may be used to further tune the electronic properties of the CAS derived NPs or thin films (e.g. carrier concentration). Up to 5% of one or more element/s and/or element containing compound/s may be introduced, preferably below 2% doping with any group 14 material, including, but not limited to, C, Si, Ge, Sn, Pb, Bi, and/or combination thereof.

The following Examples serve as illustrations of the principles disclosed herein.

EXAMPLES

Example 1

Sulfide Based CAS Derived NPs with Tetragonal Crystal Structure ($Cu_3AsS_4$-like)

$Cu_3(As_{0.75},Sb_{0.25})S_4$ NP Synthesis

Standard air-free and Schlenk techniques are followed for the synthesis of the CAS derived NPs. Oleylamine used for synthesis was degassed by freeze, pump, thaw, and stored in an inert environment. In an exemplary CAS derived NP synthesis, two precursor solutions are reacted in a third flask containing OLA to form the CAS derived NPs. In a round bottom flask, 5 mL of OLA, 1.0 mmol of copper(I) chloride, 0.268 mmol of arsenic trichloride, 0.089 mmol of antimony trichloride is heated to 85° C. for about two hours with stirring to yield precursor solution A.

In another round bottom flask, a sulfur-OLA solution is formulated by adding 5 mmol of sulfur powder to 5 mL of OLA. The mixture is stirred for about 60 min with gentle heating around 60° C. until dissolved to give sulfur-OLA yielding precursor solution B. In a 100 mL 3-neck flask equipped with a condenser and thermocouple adapter, 7 mL of OLA is added. The 100 mL 3-neck flask is attached to a Schlenk line and evacuated and refilled with argon three times. The flask is left under vacuum and heated to reflux (~130° C.) for about one hour. The 3-neck flask is returned to argon atmosphere and the temperature is adjusted to about 100° C. to 364° C. (preferably from about 150° C. to 225° C.), at which point, 0.8 mL of precursor solution B is injected via syringe. After 20 seconds, 2.0 mL of precursor solution A is also rapidly injected into the 3-neck flask. The reaction proceeds for about 10 minutes to completion. The heating mantle is removed and the 3-neck flask is cooled to below 40° C. before opening to air for collection by centrifugation in a 5:1 mixture of ethanol and hexane.

$Cu_3(As_{0.5},Sb_{0.5})S_4$ NP Synthesis

The procedure for the synthesis of $Cu_3(As_{0.75},Sb_{0.25})S_4$ is followed except precursor A is formulated by adding 5 mL of OLA, 1.0 mmol of copper(I) chloride, 0.179 mmol of arsenic trichloride, 0.179 mmol of antimony trichloride to a round bottom flask with to 85° C. for about two hours while stirring to yield precursor solution A.

$Cu_3(As_{0.25},Sb_{0.75})S_4$ NP Synthesis

The procedure for the synthesis of $Cu_3(As_{0.75},Sb_{0.25})S_4$ is followed except precursor A is formulated by adding 5 mL of OLA, 1.0 mmol of copper(I) chloride, 0.089 mmol of arsenic trichloride, 0.268 mmol of antimony trichloride to a round bottom flask with to 85° C. for about two hours while stirring to yield precursor solution A.

$Cu_3SbS_4$ NP Synthesis

The procedure for the synthesis of $Cu_3SbS_4$ is followed except precursor A is formulated by adding 5 mL of OLA, 1.0 mmol of copper(I) chloride and 0.357 mmol of antimony trichloride to a round bottom flask with to 85° C. for about two hours while stirring to yield precursor solution A.

$Cu_3AsS4$ NP Synthesis

The procedure for the synthesis of $Cu_3AsS_4$ is followed except precursor A is formulated by adding 5 mL of OLA, 1.0 mmol of copper(I) chloride and 0.357 mmol of arsenic trichloride to a round bottom flask with to 85° C. for about two hours while stirring to yield precursor solution A.

FIG. 1 shows a typical glassware setup used for all CAS derived NP synthesis.

Figure 2:
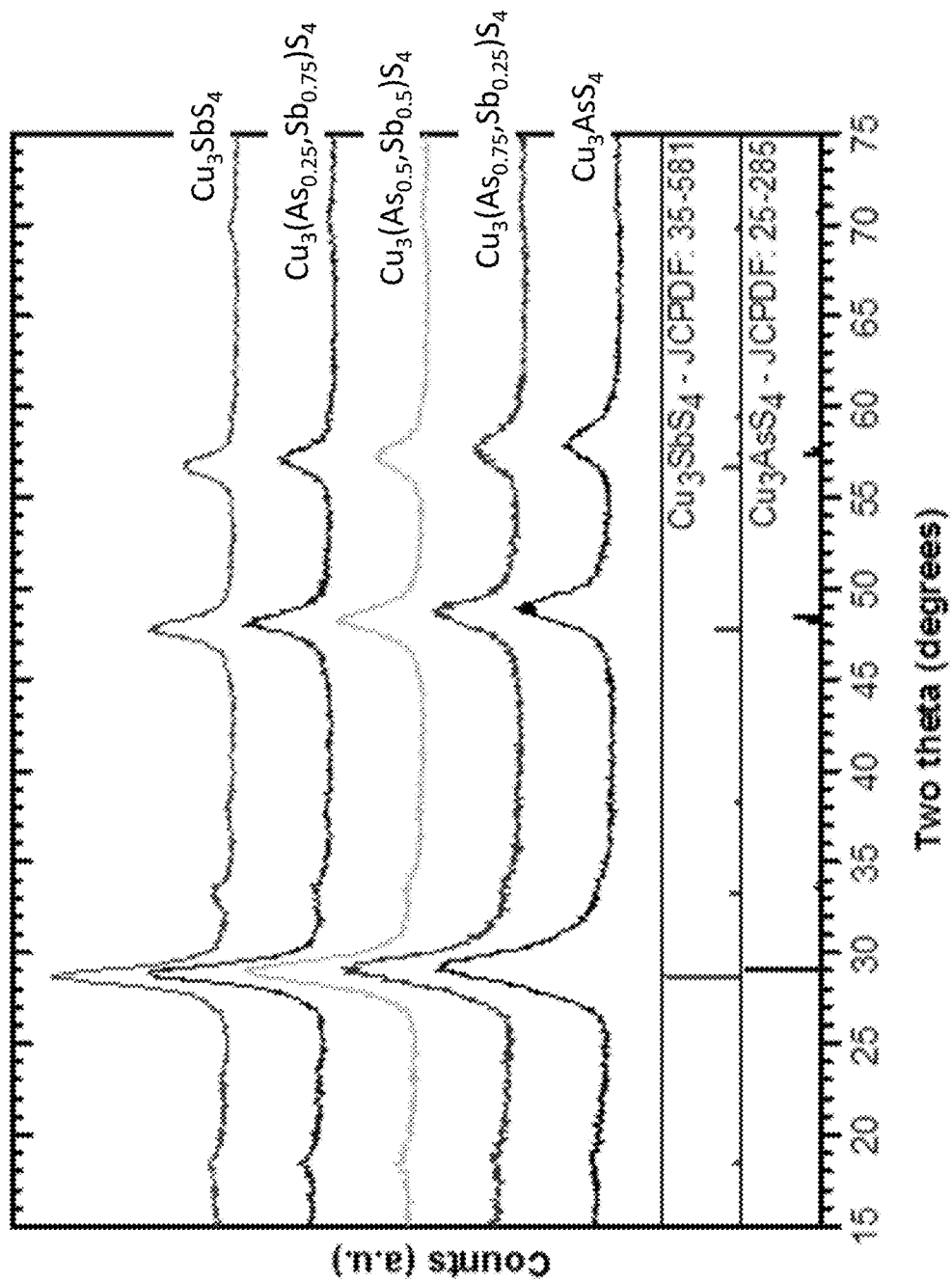
FIG. 2 shows the XRD patterns obtained for various compositions of synthesized $Cu_3(As,Sb)S_4$ CAS derived NPs at 175° C.

FIG. 2 shows the XRD patterns obtained for various compositions of synthesized sulfide based CAS derived NPs at 175° C. synthesized per the compositions in example 1. The patterns closely match standard reference patterns from the Inorganic Crystal Structure Database for $Cu_3SbS_4$, JCPDS #35-581 and $Cu_3AsS_4$, JCPDS #25-285. Furthermore, Vegart's law predicts the observed peak shifting to lower two theta with increasing antimony composition.

Figure 3:
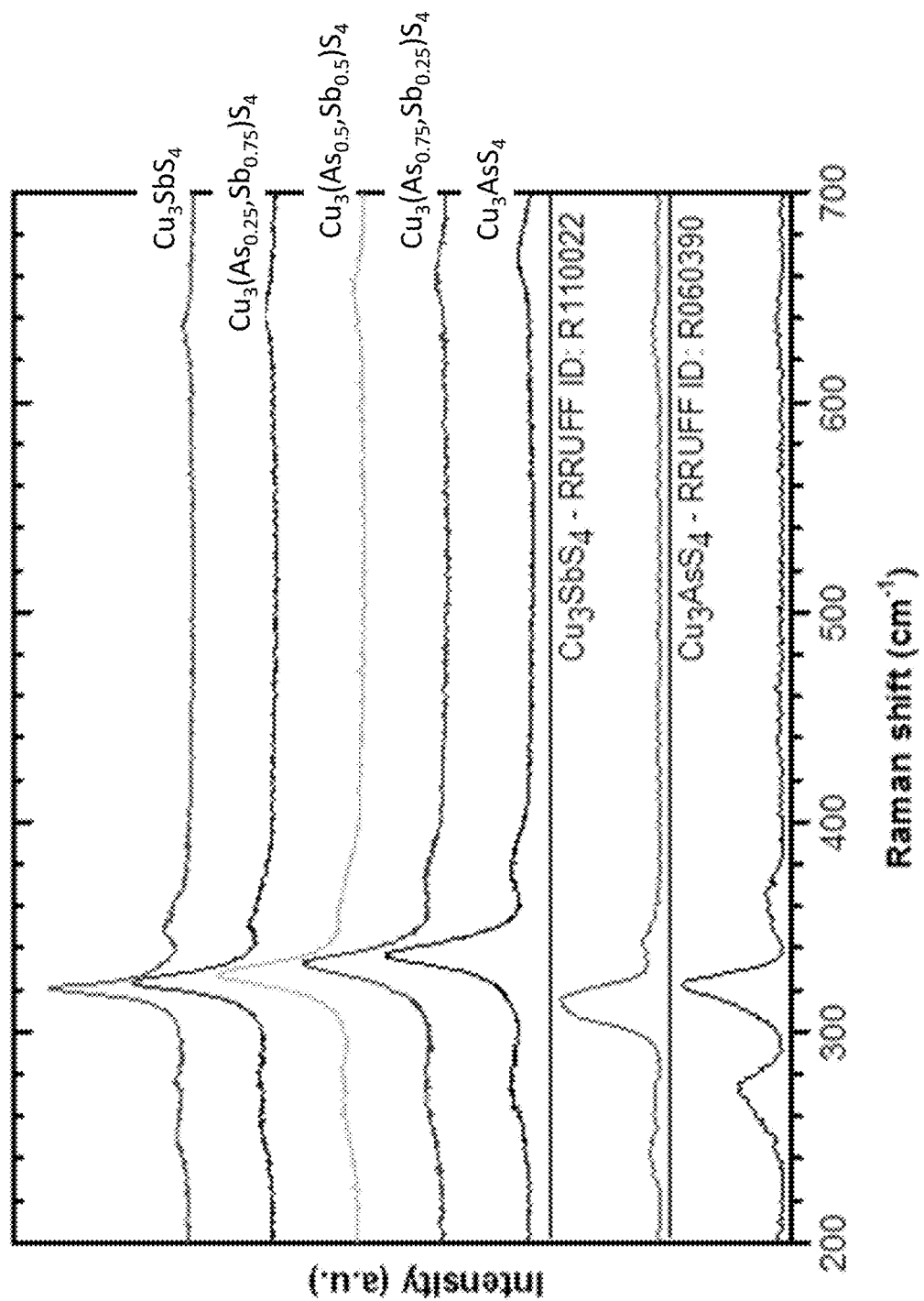
FIG. 3 shows the Raman spectra obtained for various compositions of synthesized $Cu_3(As,Sb)S_4$ CAS derived NPs at 175° C.

FIG. 3 shows the Raman spectra obtained for various compositions of synthesized sulfide based CAS derived NPs synthesized per the compositions in example 1. The obtained pattern closely matches the natural mineral forms of $Cu_3SbS_4$ (RRUFF ID: R110022) and $Cu_3AsS_4$ (RRUFF ID: R060390) with all other compositions shifting in between.

Figure 4:
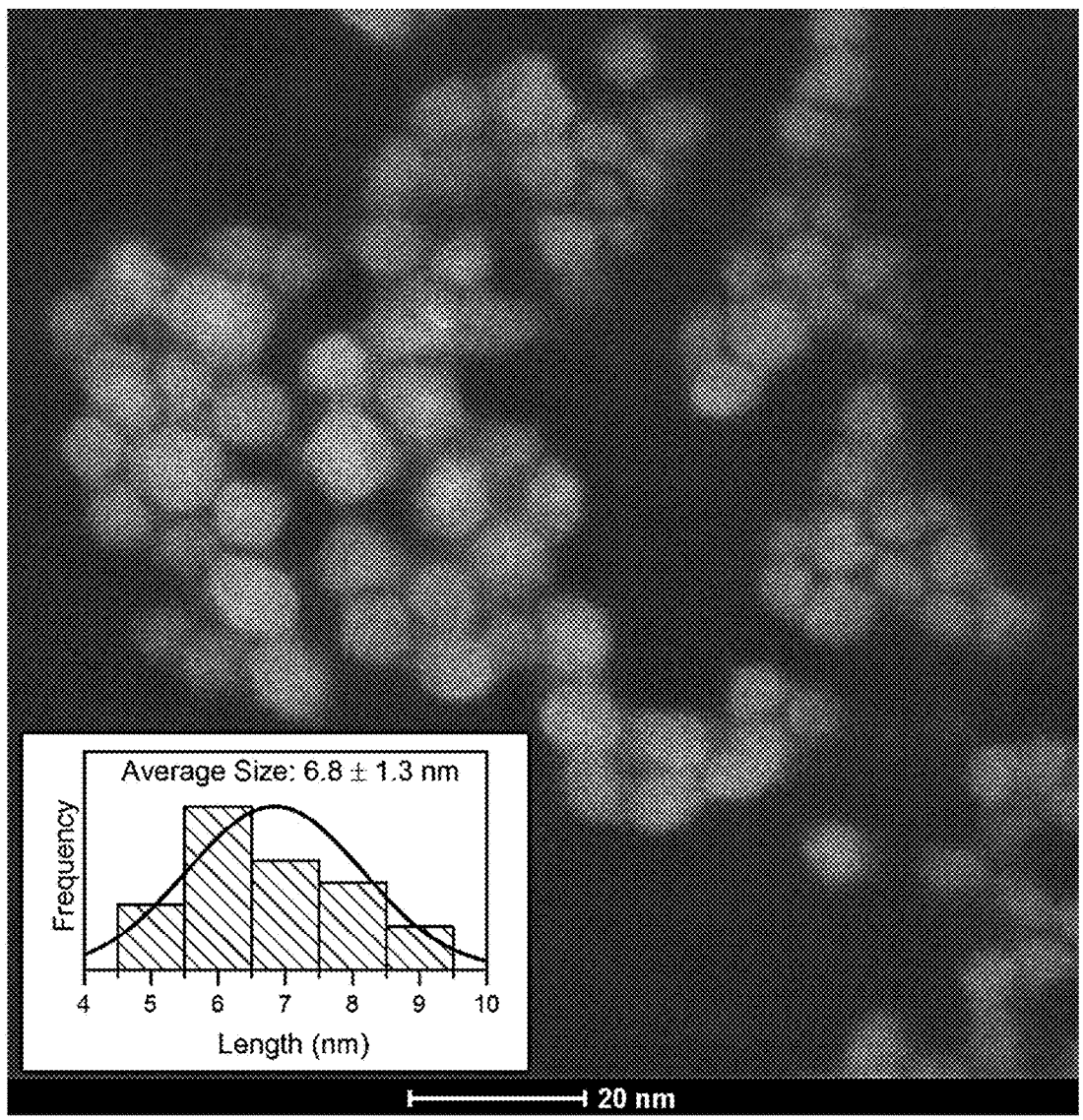
FIG. 4 shows a transmission electron microscopy (TEM) image and size distribution histogram of the synthesized CAS derived NPs with an approximate composition of $Cu_3(As_{0.5}Sb_{0.5})S_4$.

FIG. 4 shows a transmission electron microscopy (TEM) image of the synthesized sulfide based CAS derived NPs with an approximate composition of $Cu_3(As_{0.5}Sb_{0.5})S_4$. About 50 CAS derived NPs have were surveyed and demonstrate an approximate average size of 6.8±1.2 nm.

FIG. 5 shows the elemental composition of the sulfide based CAS derived NPs using scanning electron microscopy energy dispersive X-ray spectroscopy (SEM-EDS) for the several compositions synthesized per example 1. As seen from this FIG. 5, $X_1$ ranges from 2.64 to 3.32 and $X_2$ from 0.98 to 1.21 for the synthesized NPs.

Figure 6:
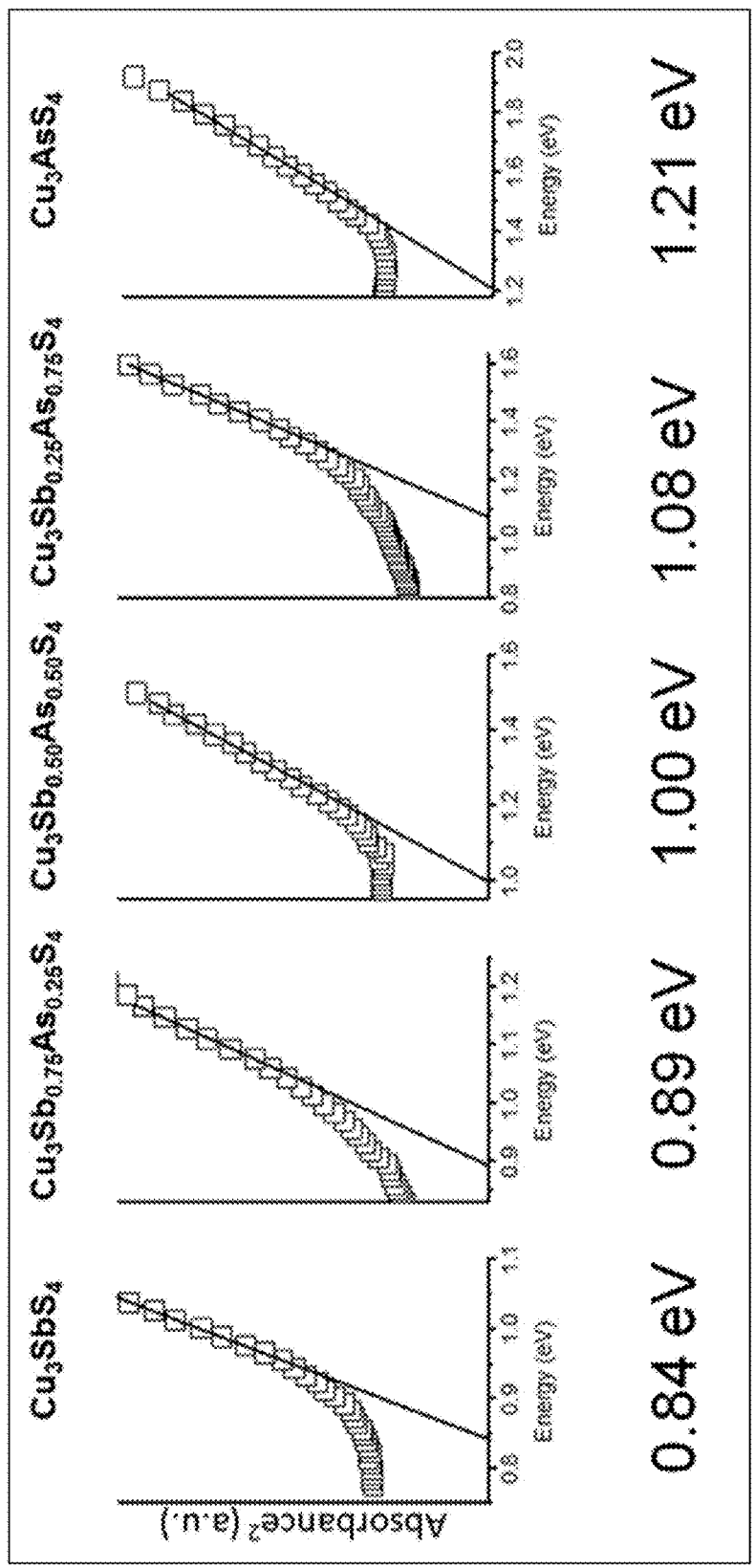
FIG. 6 shows increasing band gap energy sulfide based CAS derived NPs with increasing arsenic incorporation.

FIG. 6 shows increasing band gap energy for sulfide based CAS derived NPs with increasing arsenic incorporation synthesized per example 1. The gradual shift in peak locations and validity of Vegard's law in X-ray diffraction patterns of FIG. 2, the gradual shift in the peaks of the Raman spectra in FIG. 3 as well as gradual change in band gap in FIG. 6 are the indication that As and Sb are uniformly distributed within the $Cu_3(As_x,Sb_y)S_4$ NPs. Thus the synthesis method used not only does not make impurities such as $Cu_2S$, etc., but also uniquely makes the uniform alloy of As with Sb in $Cu_3(As_x,Sb_y)S_4$ NPs.

Example 2

Sulfide Based CAS Derived NPs with Cubic Crystal Structure ($Cu_{12}As_4S_{13}$ like)

$Cu_{12}(As_{0.75}, Sb_{0.25})_4S_{b\ 13}$ NP Synthesis

The synthesis procedure is performed similarly to the $Cu_3(As_{0.75},Sb_{0.25})S_4$ NPs except for an injection and reaction temperature of typically about 225° C.-411° C. (more typically from 225° C. to 275° C.) for about 30 min. Note that as compared to $Cu_3(As_x,Sb_y)S_4$, the temperature range for the reaction is typically hotter.

$Cu_{12}(As_{0.50},Sb_{0.50})_4S_{13}$ NP Synthesis

The synthesis procedure is the same as the $Cu_3(As_{0.5}, Sb_{0.5})S_4$ NPs except for an injection and reaction temperature of about 225° C. to 411° C. (more typically from 225° C. to 275° C.) for about 30 min.

$Cu_{12}(As_{0.25},Sb_{0.75})_4S_{13}$ NP Synthesis

The synthesis procedure is the same as the $Cu_3(As_{0.25}, Sb_{0.75})S_4$ NPs except for an injection and reaction temperature of about 225° C.-411° C. (more typically from 225° C. to 275° C.) for about 30 min.

$Cu_{12}Sb_4S_{13}$ NP Synthesis

The synthesis procedure is the same as the $Cu_3SbS_4$ NPs except for an injection and reaction temperature of about 225° C. to 411° C. (more typically from 225° C. to 275° C.) for about 30 min.

$Cu_{12}As_4S_{13}$ NP Synthesis

The synthesis procedure is the same as the $Cu_3AsS_4$ NPs except for an injection and reaction temperature of about 225° C. to 411° C. (more typically from about 225° C. to 275° C.) for about 30 min.

Figure 7:
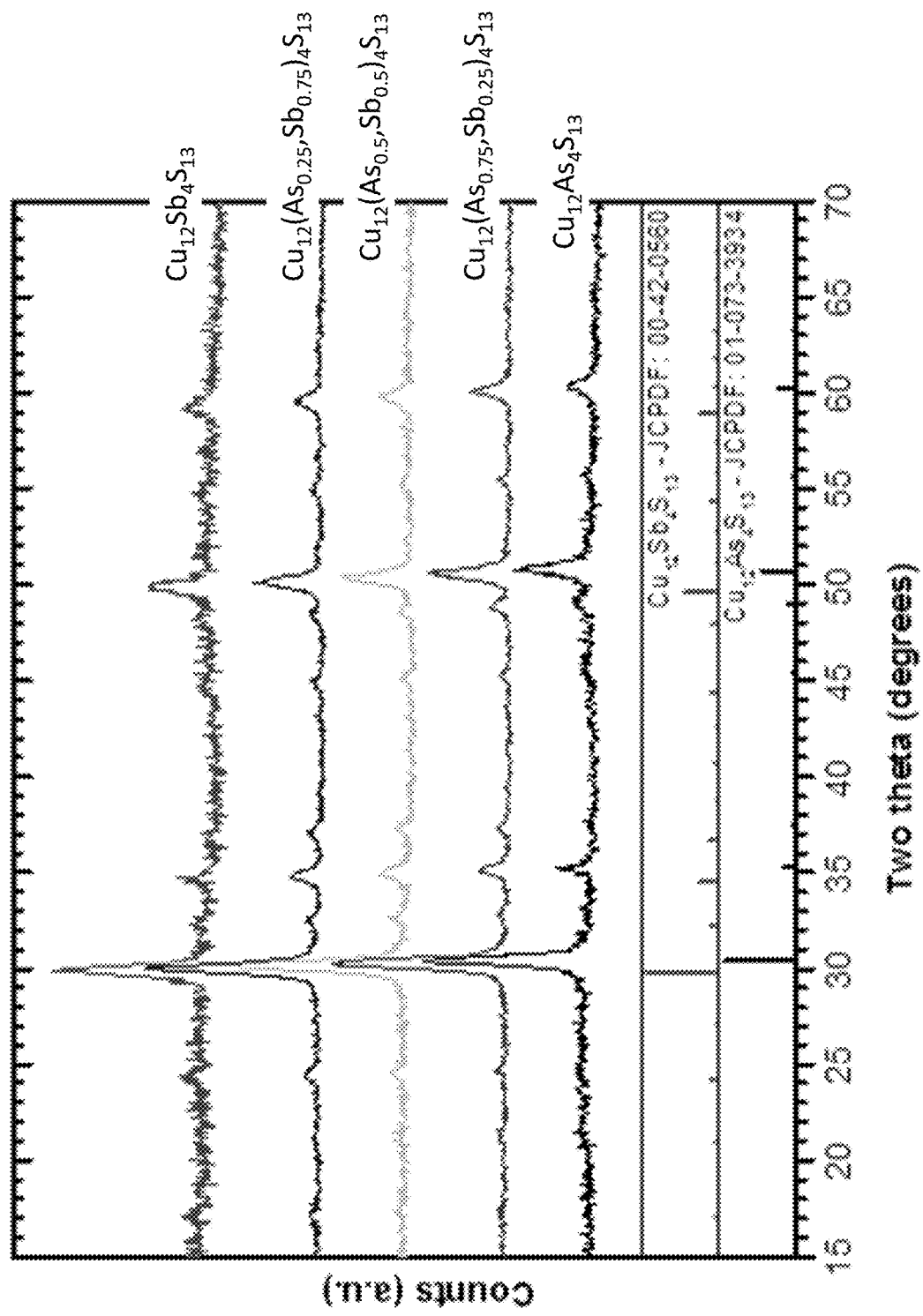
FIG. 7 shows the XRD patterns obtained for various compositions of synthesized cubic $Cu_{12}(As,Sb)_4S_{13}$ NPs at 250° C.

FIG. 7 shows the XRD patterns obtained for various compositions of synthesized cubic ($Cu_{12}(As,Sb)_4S_{13}$) derived NPs at 250° C.: (a) $Cu_{12}As_4S_{13}$, (b) $Cu_{12}(As_{0.75}, Sb_{0.25})_4S_{13}$ (c) $Cu_{12}(As_{0.5}Sb_{0.5})_4S_{13}$, (d) $Cu_{12}(As_{0.75}Sb_{0.25})_4S_{13}$ and (e) $Cu_{12}As_4S_{13}$ synthesized per example 2. The patterns closely match standard reference patterns from the Inorganic Crystal Structure Database for $Cu_{12}Sb_4S_{13}$ (JCPDS #00-42-0560) and $Cu_{12}As_4S_{13}$ (JCPDS #01-073-3934) with the predicted shift of peak locations according to Vegart's law.

Figure 8:
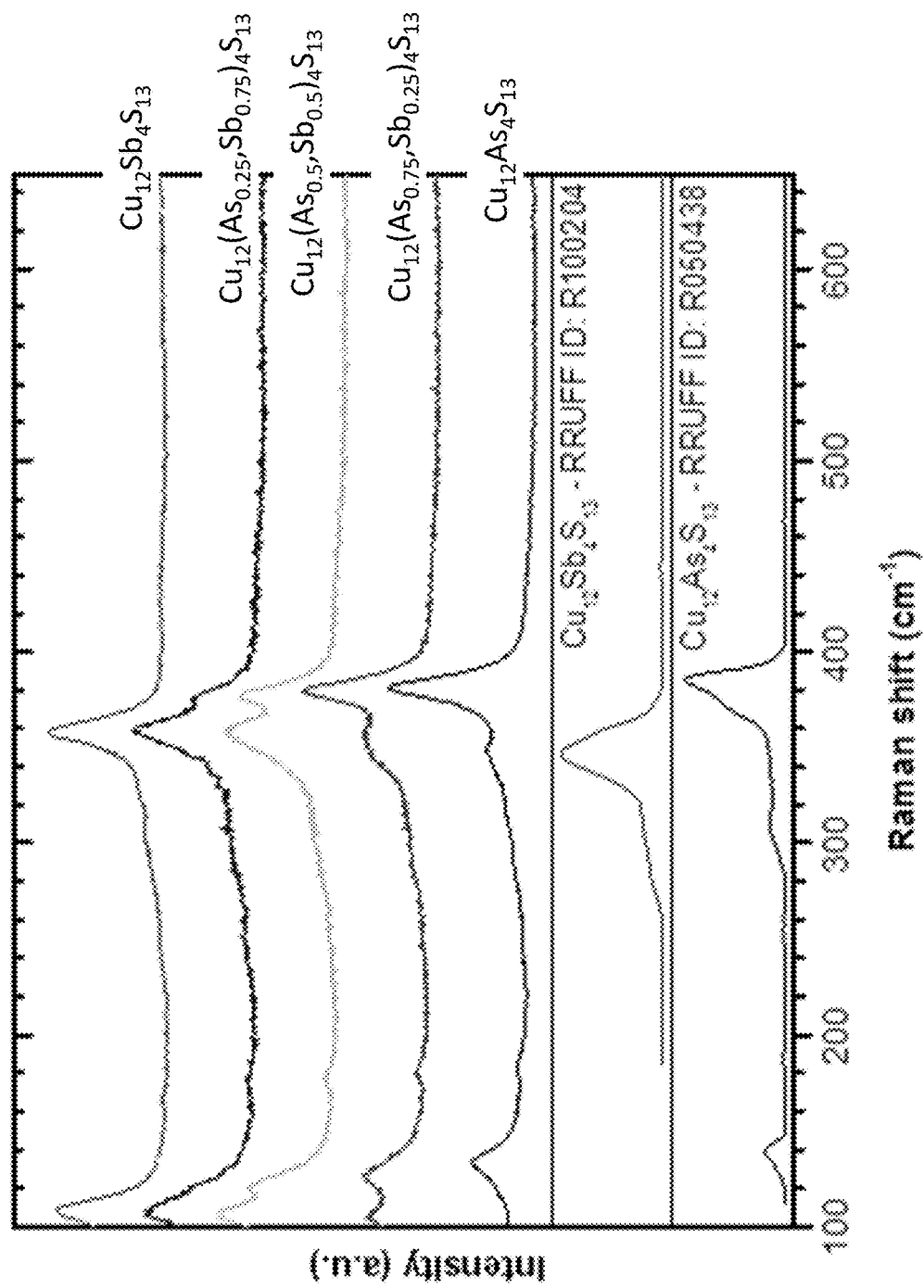
FIG. 8 shows the Raman spectra obtained for various compositions of synthesized cubic $Cu_{12}(As,Sb)_4S_{13}$ NPs at 250° C.

FIG. 8 shows the Raman spectra obtained for various compositions of sulfide based synthesized CAS derived NPs with cubic crystal structure at 250° C.: (a) $Cu_{12}As_4S_{13}$, (b) $Cu_{12}(AS_{0.75},Sb_{0.25})_4S_{13}$ (C) $Cu_{12}(AS_{0.5}Sb_{0.5})_4S_{13}$, (d) $Cu_{12}(AS_{0.25}Sb_{0.75})_4S_{13}$ and (e) $Cu_{12}Sb_4S_{13}$ synthesized per example 2. The patterns closely match reference spectra from the RRUFF database for $Cu_{12}Sb_4S_{13}$ (RRUFF ID: R100204) and $Cu_{12}As_4S_{13}$ (RRUFF ID: R050438) with intermediate compositions shifting towards the end member composition. No evidence of impurity phase can be detected. From FIGS. 8 and 9, it is demonstrated that the novel synthesis method is unique in providing uniform alloy of As and Sb in $Cu_{12}(As_x,Sb_y)S_{13}$ NPs.

Example 3

Selenide Based CAS Derived NPs with Tetragonal Crystal Structure ($Cu_3AsSe_4$ like)

$Cu_3(As_{0.72},Sb_{0.25})Se_4$ NP Synthesis

Standard air-free and Schlenk techniques are followed for the synthesis of the $Cu_3(As,Sb)Se_4$ CAS derived NPs. Oleylamine used for synthesis was degas sed by freeze, pump, thaw and stored in an inert environment. In an exemplary $Cu_3(As,Sb)Se_4$ CAS derived NP synthesis, a precursor solution is prepared in a reaction vessel containing 7 mL of OLA, 1.0 mmol of copper(I) chloride, 0.268 mmol of arsenic trichloride, 0.089 mmol of antimony trichloride. The reaction vessel is attached to a Schlenk line and evacuated and refilled with argon with stirring to purge the contents of oxygen.

A selenium based chalcogen compound was prepared. Briefly, in a round bottom flask, a selenium-OLA solution is formulated by adding 5 mmol of selenium powder to 5 mL of OLA and 0.5 mL of ethanethiol (ET). The mixture is stirred for about 15 min. The round bottom flask is then evacuated for 60 min with stirring to selectively remove the ET giving a precursor solution B.

The reaction vessel is rapidly heated to about 100° C. to 364° C., typically from 175° C. to 300° C., at which point, 2.8 mL of precursor solution B (Se in OLA) is injected via a purged syringe. The reaction proceeds for about 30 min to completion. The heating mantle is removed and the 3-neck flask is cooled to below 40° C. before opening to air for collection by centrifugation in a 5:1 mixture of ethanol and hexane. About 2 washes are performed.

A selenium etch can be performed to remove any unreacted selenium from the samples to provide impurity free NPs. After the 2 normal washes as described earlier, the NPs are resuspended in about 10:1 OLA to ET, vortexed and centrifuged at about 14,000 rpms for about 1 min to precipitate. The supernatant is decanted and the NPs were resuspended once more with OLA and ET to remove any residual selenium and centrifuged at about 14,000 rpms for about 1 min. The supernatant is discarded and the NPs are washed/collected using hexane/ethanol (1:5) v/v two more times. Intentional residual selenium can also be intermixed with the CAS derived NPs or removed via vacuum, calcining or annealing.

$Cu_3(As_{0.5},Sb_{0.5})Se_4$ NP Synthesis

The synthesis procedure is the same as the above synthesis for the selenide based $Cu_3(As_{0.75},Sb_{0.25})Se_4$ derived NPs except for except the reaction flask contains 7 mL of OLA, 1.0 mmol of copper(I) chloride, 0.179 mmol of arsenic trichloride, and 0.179 mmol of antimony trichloride.

$Cu_3(As_{0.25},Sb_{0.75})Se_4$ NP Synthesis

The synthesis procedure is the same as the above synthesis for the selenide based $Cu_3(As_{0.75},Sb_{0.25})Se_4$ derived NPs except for except the reaction flask contains 7 mL of OLA, 1.0 mmol of copper(I) chloride, 0.268 mmol of arsenic trichloride, and 0.089 mmol of antimony trichloride.

$Cu_3SbSe_4$ NP Synthesis

The synthesis procedure is the same as the above synthesis for the selenide based $Cu_3(As_{0.75},Sb_{0.25})Se_4$ derived NPs except for except the reaction flask contains 7 mL of OLA, 1.0 mmol of copper(I) chloride and 0.357 mmol of antimony trichloride.

$Cu_3AsSe_4$ NP Synthesis

To maintain phase purity throughout all compositions according to XRD and Raman, the synthesis procedure for the $Cu_3AsSe_4$ must be performed with slightly different conditions to the above synthesis for the selenide based $Cu_3(As_{0.75},Sb_{0.25})Se_4$ derived NPs. Now the reaction flask contains 7 mL of OLA, 1.0 mmol of copper(I) chloride and 0.357 mmol of arsenic trichloride. A low temperature injection of 2.8 mL of the selenium precursor from about 20° C. to about 225° C., preferably between about 50° C. and 150° C. followed by rapid heating of the reaction vessel from about 150° C. to 225° C. for about 30 min. The NPs are collected and washed according to the above procedure for Example 3.

Figure 9:
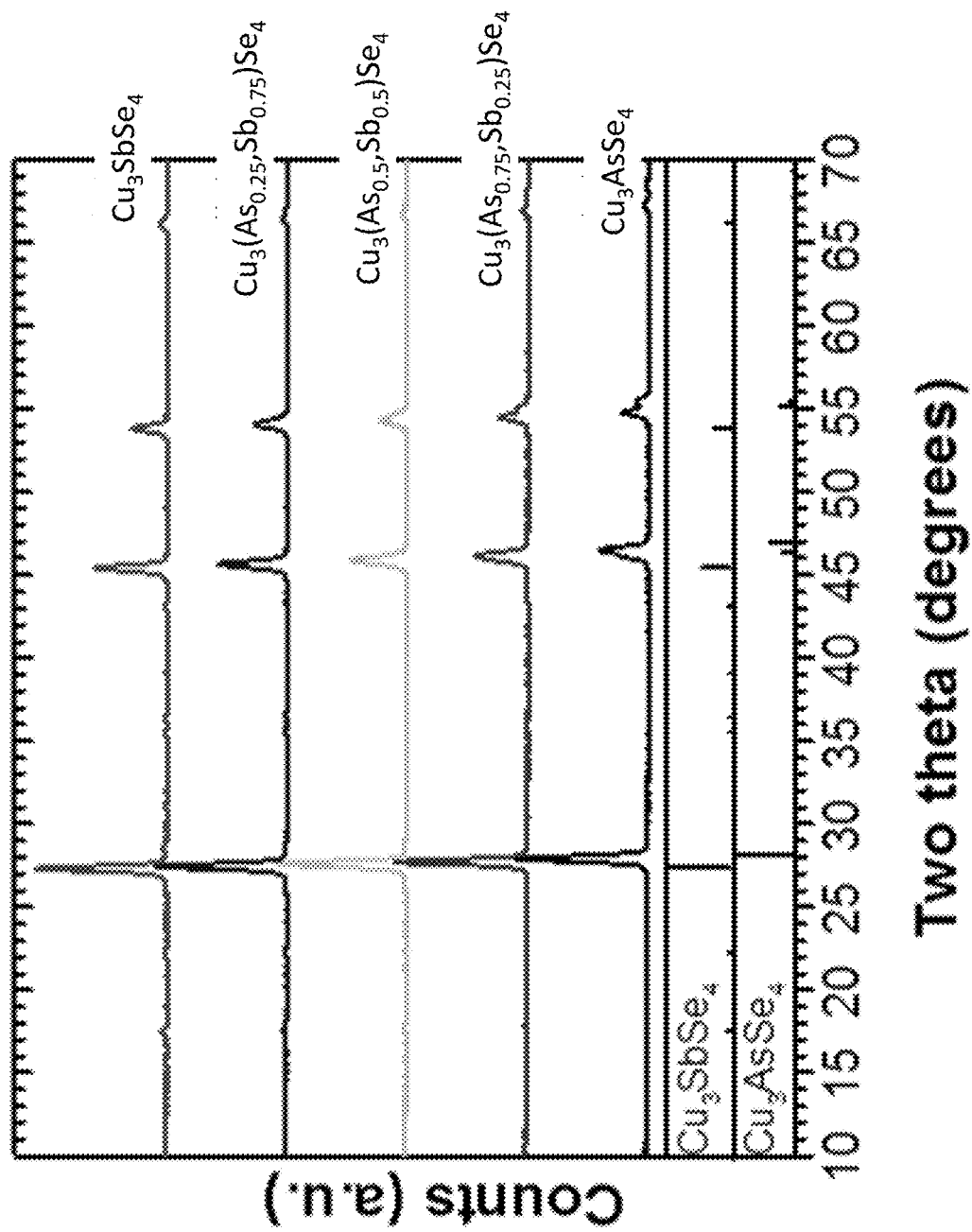
FIG. 9 shows XRD patterns of several compositions of synthesized $Cu_3(As,Sb)Se_4$ NPs.

FIG. 9 shows XRD patterns of several compositions of selenide based CAS derived NPs synthesized per example 2: (a) $Cu_3SbSe_4$, (b) $Cu_3(As_{0.25},Sb_{0.75})Se_4$, (c) $Cu_3(As_{0.5},Sb_{0.5})Se_4$, (d) $Cu_3(As_{0.75},Sb_{0.25})Se_4$ and (e) $Cu_3AsSe_4$.

Figure 10:
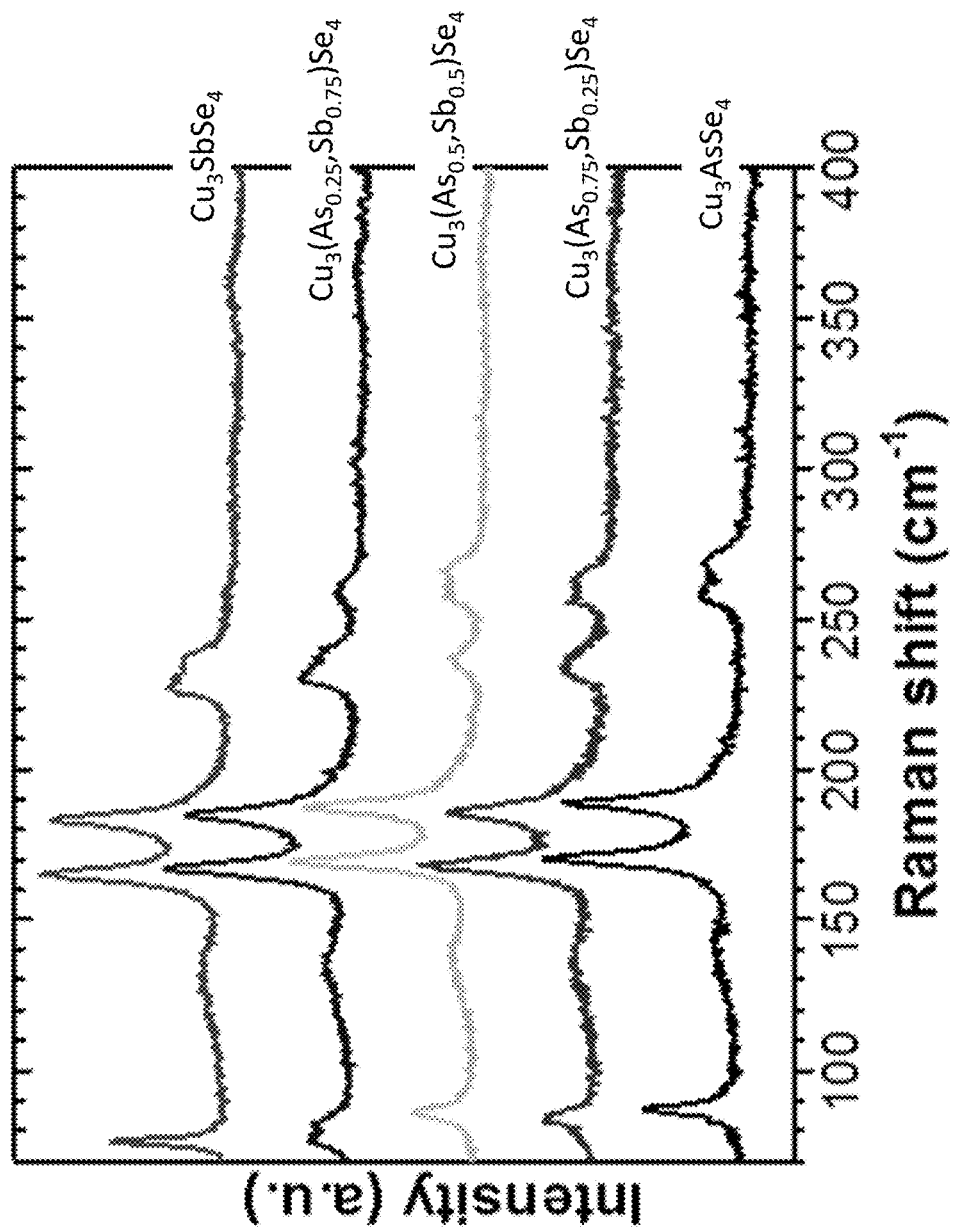
FIG. 10 shows Raman patterns of several compositions of synthesized $Cu_3(As,Sb)Se_4$ NPs.
Figure 11A:
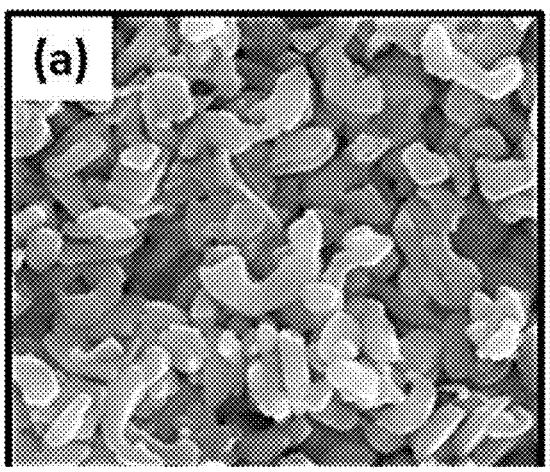
FIGS. 11A-11E show top-down SEM images of several compositions of $Cu_3(As,Sb)Se_4$ NPs.
Figure 11B:
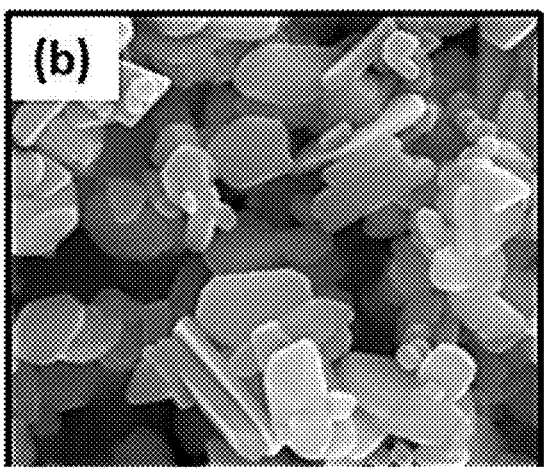
Figure 11C:
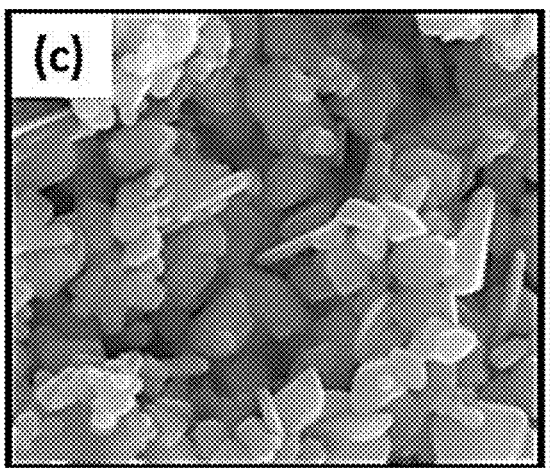
Figure 11D:
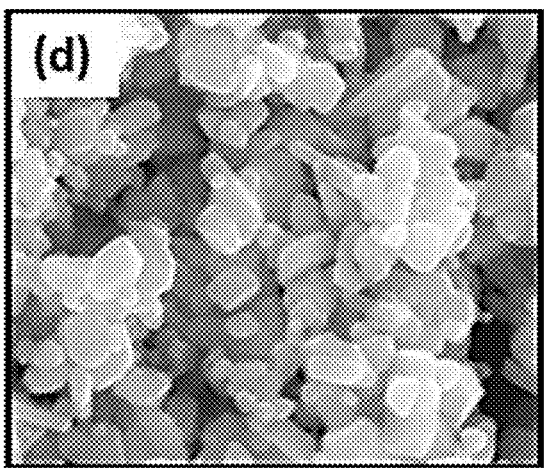
Figure 11E:
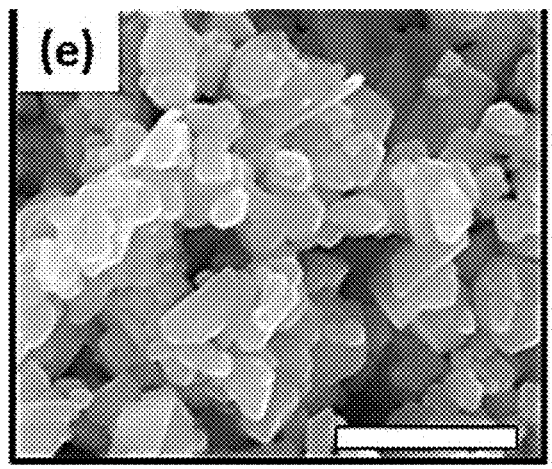

FIG. 10 shows Raman patterns of several compositions of selenide based CAS derived NPs synthesized per example 2: (a) $Cu_3SbSe_4$, (b) $Cu_3(As_{0.25}Sb_{0.75})Se_4$, (c) $Cu_3(As_{0.5},Sb_{0.5})Se_4$, (d) $Cu_3(As_{0.75},Sb_{0.25})Se_4$ and (e) $Cu_3AsSe_4$.

FIGS. 11A-11E show top down scanning electron microscopy images of several compositions of the selenide based CAS NPs synthesized per example 2: (11a) $Cu_3SbSe_4$, (11b) $Cu_3(As_{0.25},Sb_{0.75})Se_4$, (11c) $Cu_3(As_{0.5},Sb_{0.5})Se_4$, (11d) $Cu_3(As_{0.75},Sb_{0.25})Se_4$ and (11e) $Cu_3AsSe_4$.

FIG. 12 shows the elemental composition of several selenide based CAS derived NPs synthesized per example 2 using SEM-EDS. For this case, it is demonstrated that ×1 ranges from 2.52 to 3.16 and ×2 is slightly above unity. The gradual shift in peak locations and validity of Vegard's law in X-ray diffraction patterns in FIG. 9, as well as the gradual shift in the peaks of the Raman spectra in FIG. 10 are indications that As and Sb are uniformly distributed within the $Cu_3(As,Sb)Se_4$ NPs. Thus the instant synthesis method not only prevents the formation and inclusion of impurities such as $Cu_2Se$, and the like, but also uniquely yields the uniform alloy of As with Sb in $Cu_3(As_x,Sb_y)Se_4$ NPs.

Example 4

Thermoelectric Property Enhancement of the $Cu_3(As,Sb)Se_4$ Alloy NPs and Chalcogen Annealing Treatment Five compositions were evaluated for their thermoelectric properties by the van der Pauw method: $Cu_3SbSe_4$, (b) $Cu_3(As_{0.25},Sb_{0.75})Se_4$, (c) $Cu_3(As_{0.5}Sb_{0.5})Se_4$, (d) $Cu_3(As_{0.75},Sb_{0.25})Se_4$ and (e) $Cu_3AsSe_4$. An increase in thermopower (Seebeck coefficient) and thermoelectric power factor is observed for the mixed alloy compositions (b,c and d). The different compositions were drop cast onto glass substrate and dried in air over night. A thickness of about 5 µm was typical for the nanocrystal thin film as measured by profilometry.

Figure 19:
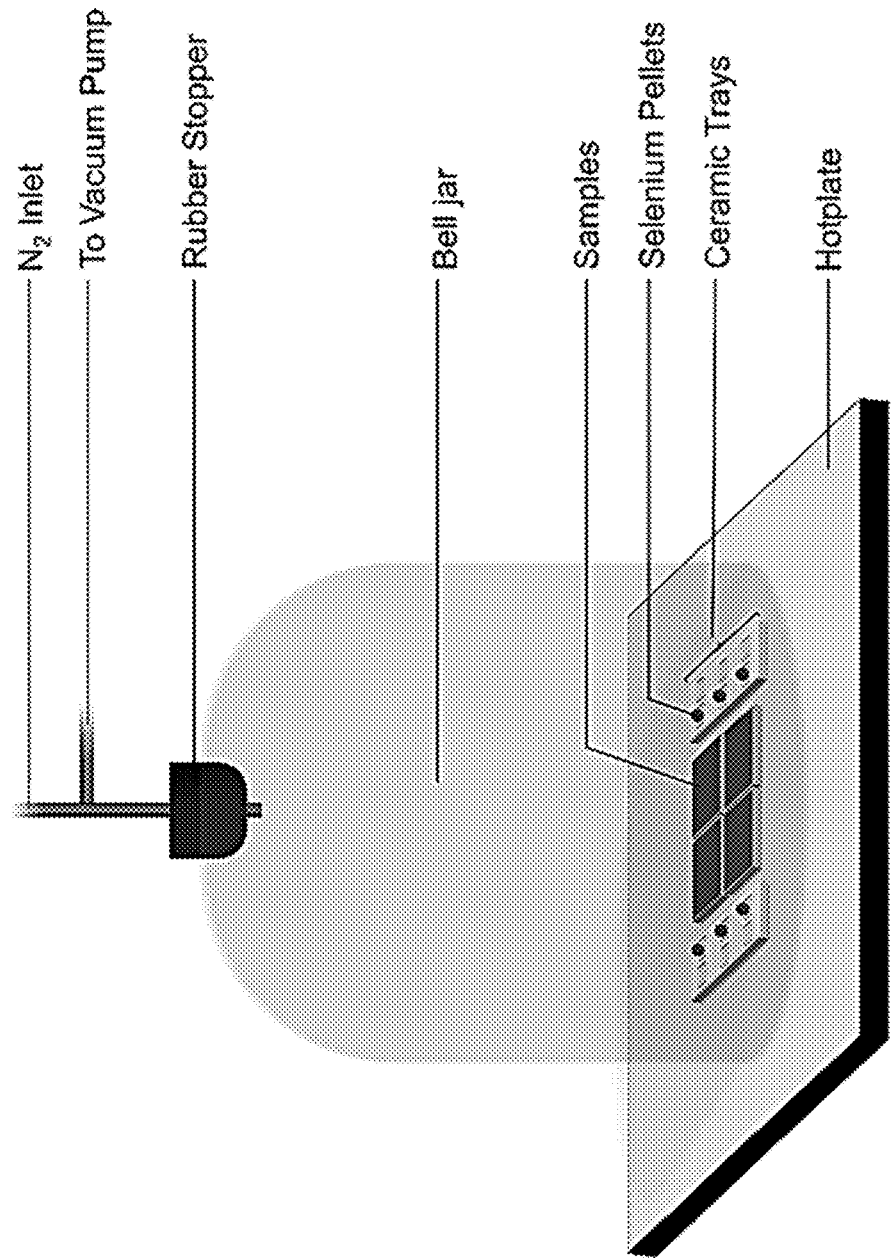
FIG. 19 is a schematic diagram illustrating the annealing apparatus.

The as-synthesized nanocrystals demonstrate very poor thermoelectric performance initially. To enhance thermoelectric properties, a chalcogen annealing or calcining step was performed by placing the nanocrystal thin films on glass into a furnace or on a hotplate. About 350 mg of selenium (or other chalcogen containing compound or mixture of compounds) was placed in ceramic boats on both sides of the drop cast nanocrystals. The films and selenium were sealed with a belljar or other apparatus. The belljar was evacuated and refilled with nitrogen several times to remove any oxygen and is shown in FIG. 19. A gentle vacuum was used while heating but isn't necessary. The hotplate temperature was increased to 340° C. and held for 30 min with a nitrogen flow of about 7 standard cubic feet per hour. The heating was stopped and the samples were air cooled to room temperature.

To measure the thermoelectric properties, gold contacts were evaporated onto the corners of the nanocrystal thin films. Van der Pauw measurements were then performed to determine the sheet resistance, Seebeck coefficient and thermopower.

Figures 13A, 13B:
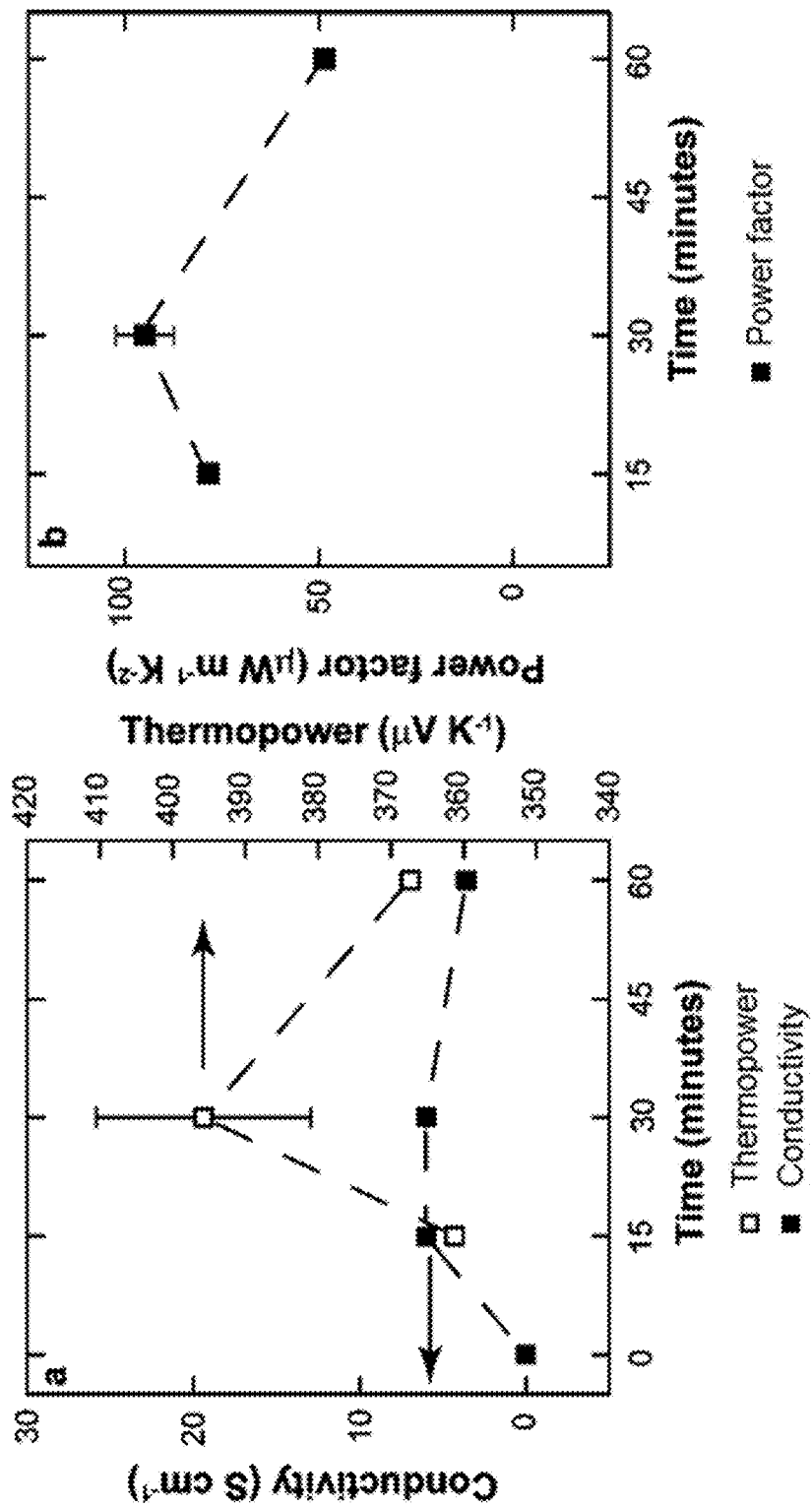
FIGS. 13A, 13B illustrate the thermoelectric properties of the highest performing alloy composition ($Cu_3(As_{0.5},Sb_{0.5})Se_4$) annealed in selenium atmosphere at 340° C. (13A) Conductivity and thermopower as a function of calcining time. Note—a thermopower measurement below the limit of detection was obtained for the as synthesized nanocrystals without calcining or annealing. (13B) Power factor as a function of calcining or annealing time.

FIGS. 13A-13B show the poor thermoelectric performance of the synthesized $Cu_3(As_{0.5},Sb_{0.5})Se_4$ nanocrystals on glass. Significant improvement is seen with selenium calcining or annealing in as little as 15 min. (13A: Conductivity and thermopower as a function of calcination or annealing time). Note—a thermopower measurement below the limit of detection was obtained for the as synthesized nanocrystals without heat treatment. (13B: Power factor as a function of annealing time).

Figures 14A, 14B:
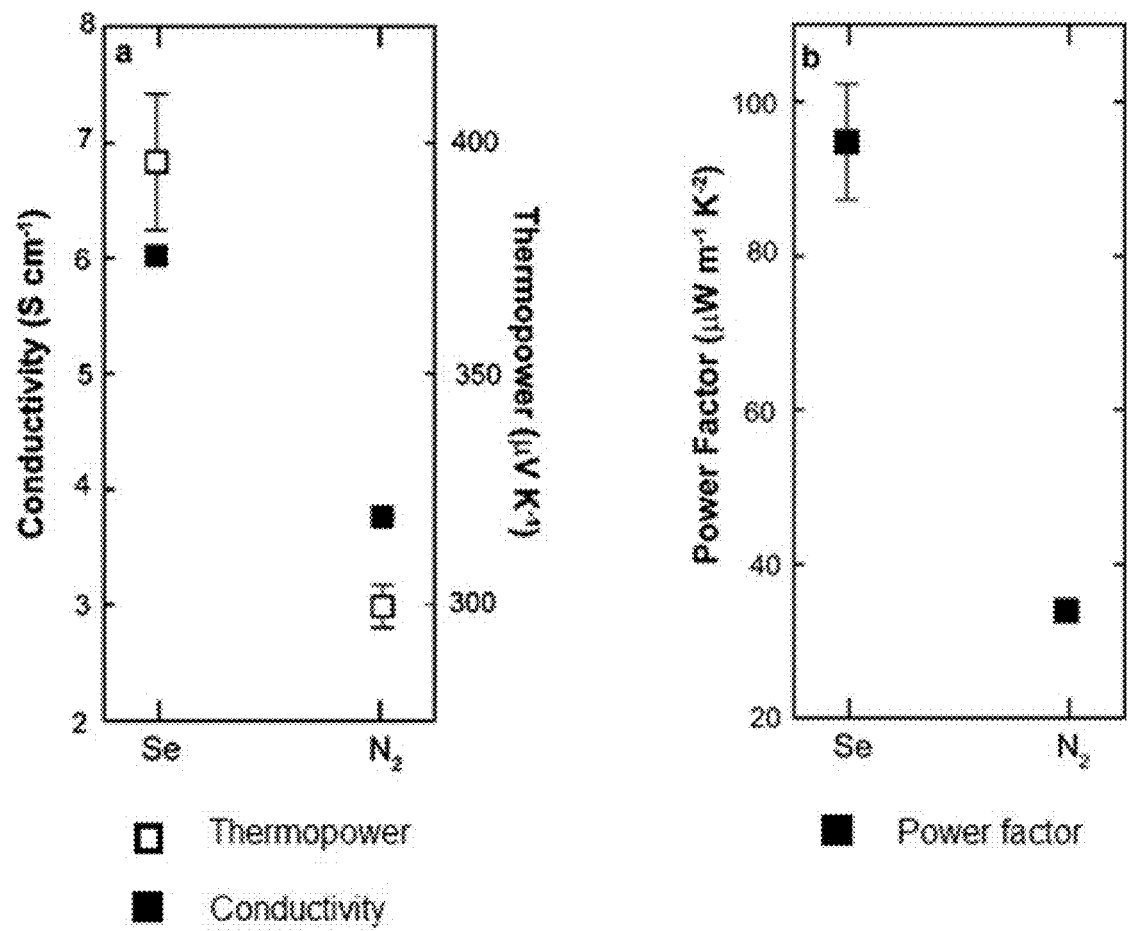
FIGS. 14A-14B illustrate the thermoelectric properties of the ($Cu_3(As_{0.5},Sb_{0.5})Se_4$) thin films annealed in nitrogen and selenium atmosphere at 340° C. for 30 min. (14A) shows significantly enhanced thermoelectric properties for the ($Cu_3(As_{0.5},Sb_{0.5})Se_4$) NPs annealed in selenium. A large increase in conductivity and thermopower for the films annealed in selenium is observed compared to calcining or annealing in $N_2$. (14B) Calculated thermoelectric power factor of the ($Cu_3(As_{0.5},Sb_{0.5})Se_4$) NP thin film annealed in selenium and nitrogen. Selenium calcining or annealing shows significant improvement in the power factor.

FIGS. 14A-14B show the thermoelectric performance after annealing in nitrogen and selenium atmosphere for the highest performing composition ($Cu_3(As_{0.5},Sb_{0.5})Se_4$). (14A: Shows significantly enhanced thermoelectric properties for the $Cu_3(As_{0.5}, Sb_{0.5})Se_4$ NPs annealed in selenium). A large increase in conductivity and thermopower for the films annealed in selenium is observed compared to calcining or annealing in $N_2$. (14B: Calculated thermoelectric power factor of the $Cu_3(As_{0.5},Sb_{0.5})Se_4$NP thin film annealed in selenium and nitrogen). Selenium calcining or annealing shows significant improvement in the power factor. Significant improvement in conductivity and Seebeck were achieved in 30 min. The highest performing samples were annealed in the selenium atmosphere.

Figures 15A, 15B, 15C:
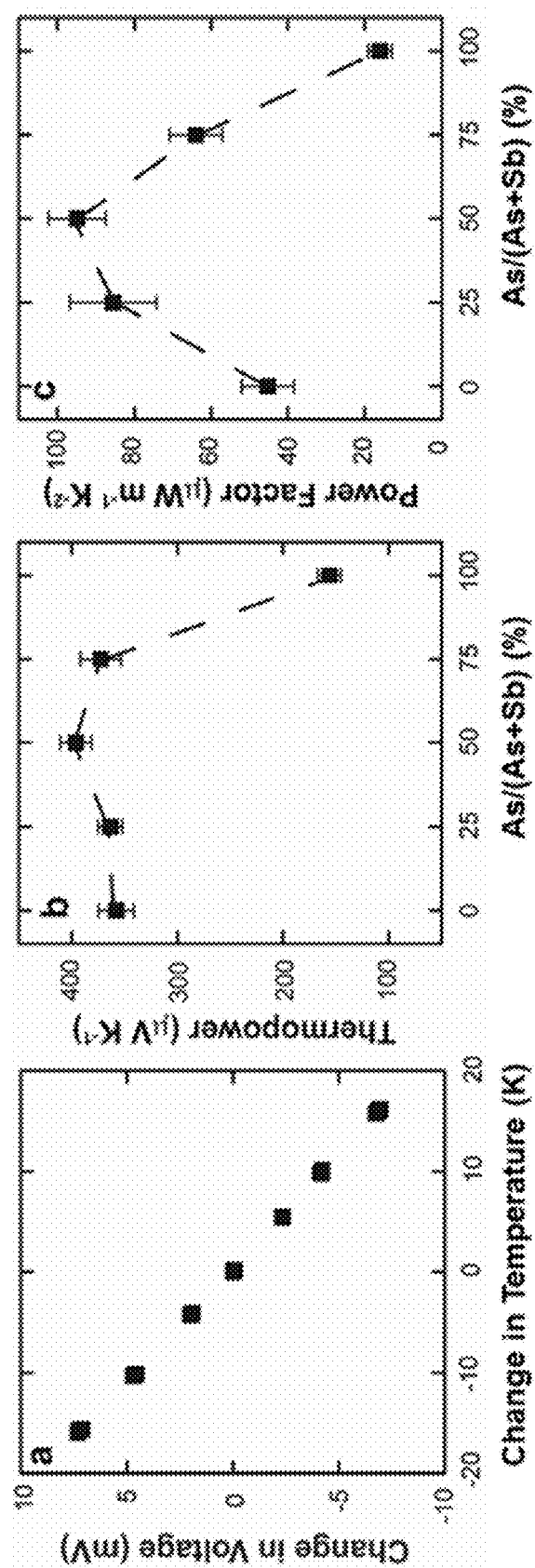
FIGS. 15A-15C illustrate thermoelectric performance of thin films of the CAS derived NP thin films after calcining or annealing in selenium atmosphere. (15A) Voltage as a function of temperature for the highest performing composition ($Cu_3(As_{0.5},Sb_{0.5})Se_4$). (15B) Thermopower as a function of arsenic in the NPs. (15C) Power factor as a function of arsenic in the NPs. The alloyed compositions display enhanced thermoelectric properties.

FIGS. 15A-15C show the thermoelectric performance enhancement resulting from the alloying of the CASe derived nanocrystals. Thin films of the CASe derived nanocrystal were measured for thermoelectric performance after heat treatment in selenium at 340° C. for 30 min. (a) Voltage as a function of temperature for the highest performing composition $Cu_3(As_{0.5}, Sb_{0.5})Se_4$. (b) Thermopower as a function of arsenic in the NPs. (c) Power factor as a function of the fraction of arsenic in the alloy. From this example 4, as seen from FIGS. 13A, 13B, 14A-14B, and 15A-15C, two unexpected findings were observed. First, the instant method of selenium heat treatment of thin CAS NPs is quite effective in providing high thermoelectric power factor; heat treatment in nitrogen is not as effective as selenium annealing or calcining in a volatilized selenium atmosphere. Also, when compared to hot pressing, heat treatment such as calcining or annealing is more amenable for roll-to-roll processing for thermoelectric devices. Further, the instant method is quite general and even valid to $Cu_3SbSe_4$ and other such materials. Second, the substitution of Sb in $Cu_3SbSe_4$ with As leads to substantial improvement in power factor (see FIG. 15C). Even a five percent to ten percent replacement of Sb with As yields substantial improvement.

Thus for $X_3$, As/(As+Sb) a greater than five percent, and, more typically, greater than ten percent, increase in power factor is observed. Such CAS compositions containing As are attractive thermoelectric materials. Also, when compared to hot pressing, heat treatment (calcining or annealing) is a more amenable roll-to-roll processing for thermoelectric devices. As shown here, the film made by chalcogen calcining or annealing of CAS films provide superior thermoelectric performance and are quite suitable to be used in thermoelectric devices. If needed, the CAS NPs may be doped with a group 14 element such as Si, Ge, Sn, Pb, and/or a combination thereof to substitute for pnictogen in the crystal lattice. This has a potential to increase carrier concentration leading to a boost in thermoelectric performance. The doping is generally less than 5% of the total cation/s in CAS and preferably less than 2% of the total cation/s.

Example 5

$Cu_3(As_{0.5},Sb_{0.5})(S_{0.5}, Se_{0.5})_4$ (CASSe) Nanoparticle Synthesis

The CASSe nanoparticles were synthesized following the methods of Example 1, but with a mixed chalcogen precursor solution, or subsequent injections of one chalcogen and/or chalcogen containing compound followed by the other. Specifically, 1 mL of the sulfur-OLA solution prepared according the Example 1 is combined with 1 mL of selenium-OLA solution prepared in Example 3 in an air free environment. The solution is sealed and vortexed to homogenize. A reaction vessel containing 7 mL of OLA attached to a Schlenk line and evacuated and refilled with argon three times to purge of oxygen. The reaction vessel is heated to a temperature of 250° C. at which point 0.8 mL of the mixed S-OLA and Se-OLA precursor is injected into the flask. Shortly after (about 20 s), 2.0 mL of the cation precursor as prepared in Example 1 are injected into the reaction vessel. The reaction is held at 250° C. for 30 min then cooled to room temperature naturally. The nanoparticles are collected by washing as described in Example 3.

Figure 16:
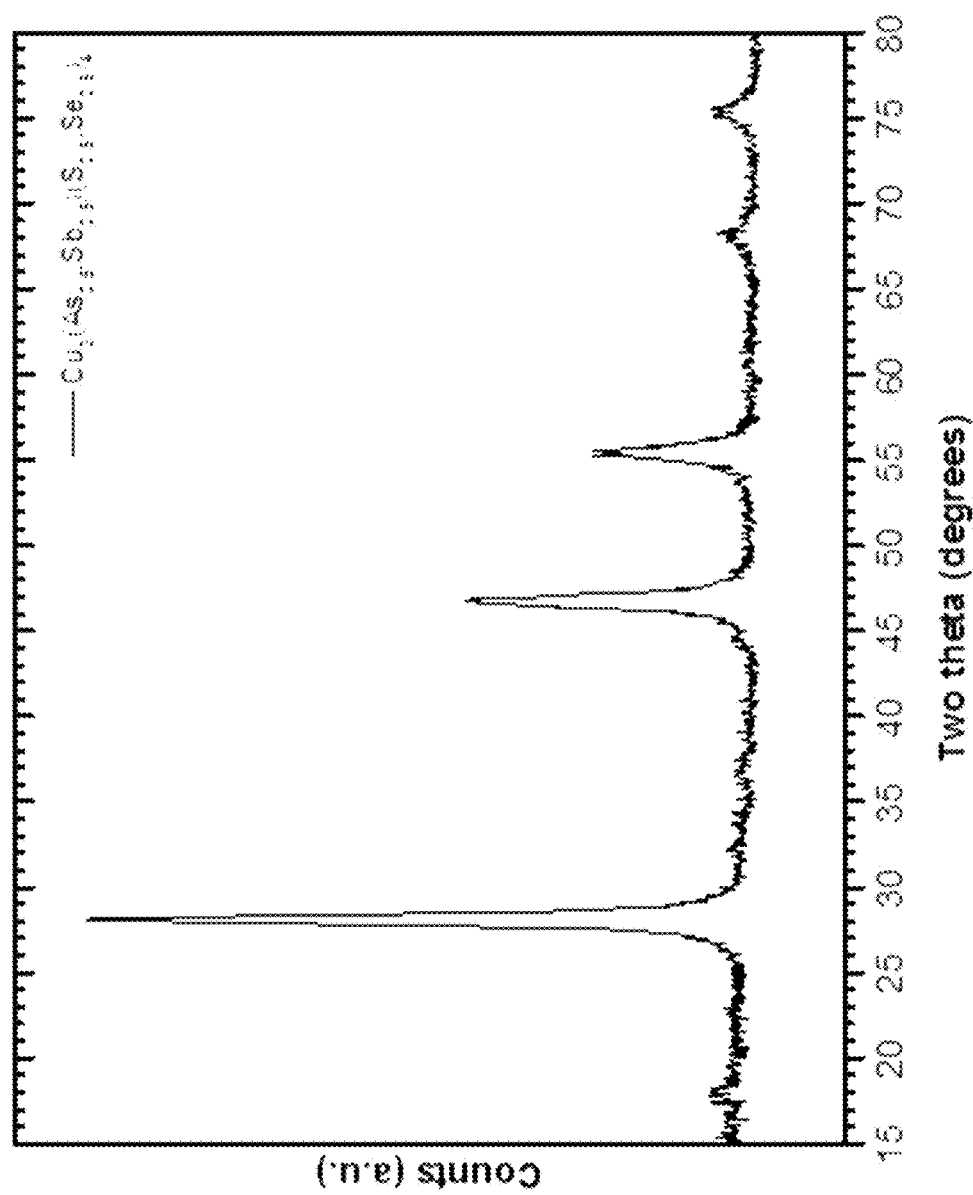
FIG. 16 shows X-ray diffraction pattern of the $Cu_3(As_{0.5},Sb_{0.5})(S_{0.5}Se_{0.5})_4$ NPs. No impurity phases are observed.

FIG. 16 shows the XRD pattern of sulfide/selenide CAS derived NPs with nominal composition of $Cu_3(As_{0.5},Sb_{0.5})(S_{0.5},Se_{0.5})_4$.

Figure 17:
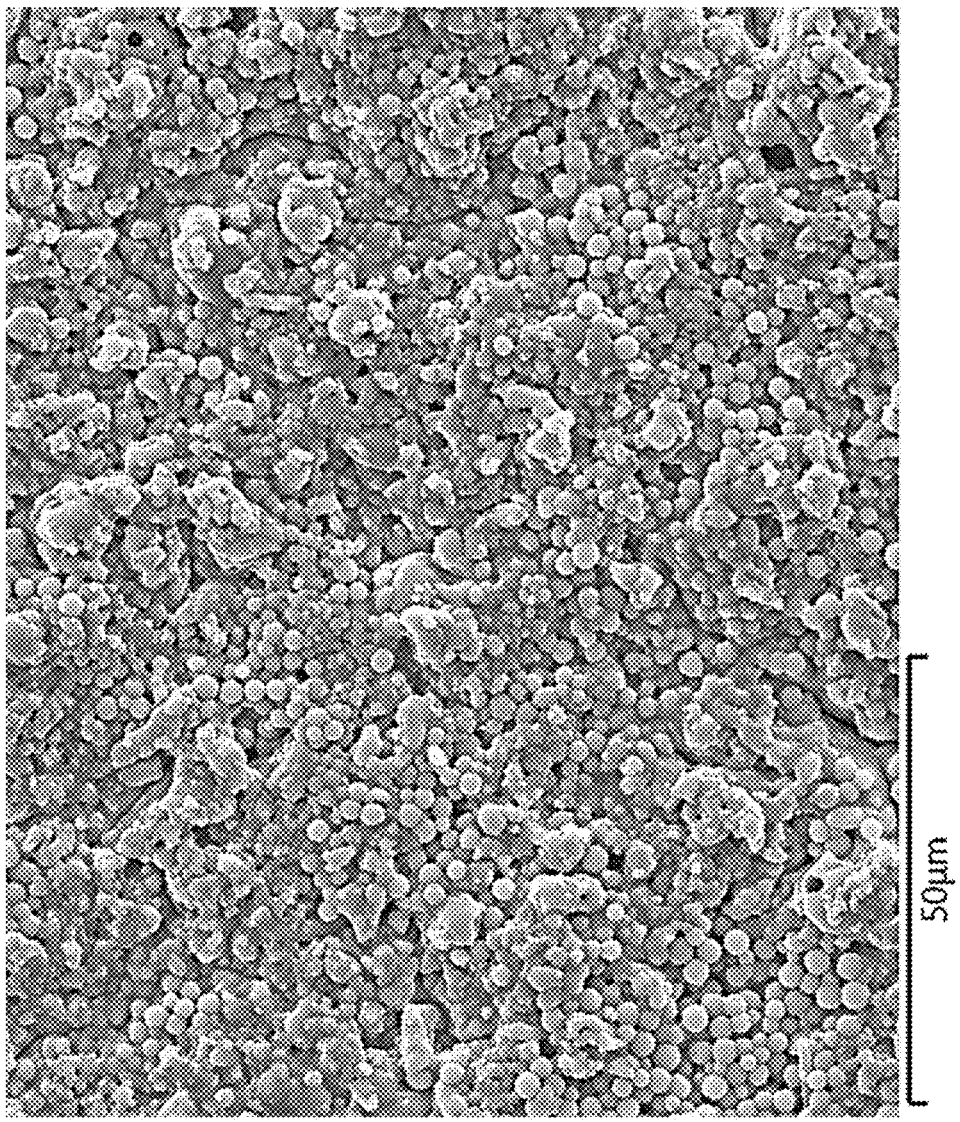
FIG. 17 shows top-down scanning electron microscopy image of the $Cu_3(As_{0.5},Sb_{0.5})(S_{0.5}Se_{0.5})_4$ nanocrystals.

FIG. 17 shows a top down scanning electron microscopy image of the sulfide/selenide CAS derived NPs with a nominal composition of $Cu_3(As_{0.5},Sb_{0.5})(S_{0.5},Se_{0.5})_4$.

FIG. 18 shows the elemental composition of the sulfide/selenide CAS derived NPs with a nominal composition of $Cu_3(As_{0.5},Sb_{0.5})(S_{0.5},Se_{0.5})_4$ using SEM-EDS.

Example 6

Enlargement and/or Densification of Grains by Selenium Annealing

Annealing or calcining the CAS derived NPs in selenium increases the grain size and density of the thin films which is very useful for a variety of applications such as solar cells and thermoelectric materials. The nanoparticles showed the highest stability in a selenium atmosphere. Calcining or annealing in the selenium atmosphere for about 30 min at about 340° C. demonstrated a significant increase in grain size after as little as 5 min.

Specifically, CAS derived NPs suspended in toluene were drop cast on glass substrates and placed dried in air for 12 h. The NP films were placed on a hotplate and selenium (~350 mg) was placed in ceramic boats on both sides of the samples. A belljar was placed over the samples and selenium and the atmosphere was evacuated and refilled with nitrogen three times to purge the heating vessel of oxygen. A constant flow of 7 standard cubic feet per hour was flowed into the vessel while a vacuum pump maintained a pressure of about 100 torr. The hotplate temperature was increased to 300° C. and maintained at that temperature for 30 min. The hotplate was then shut off and the samples and hotplate cooled naturally to about 40° C. before opening to air. Thin films were prepared on a glass substrate from the NP compositions obtained in Example 3. All these films were then annealed in selenium at 340° C. for 30 min.

Figures 20A, 20B:
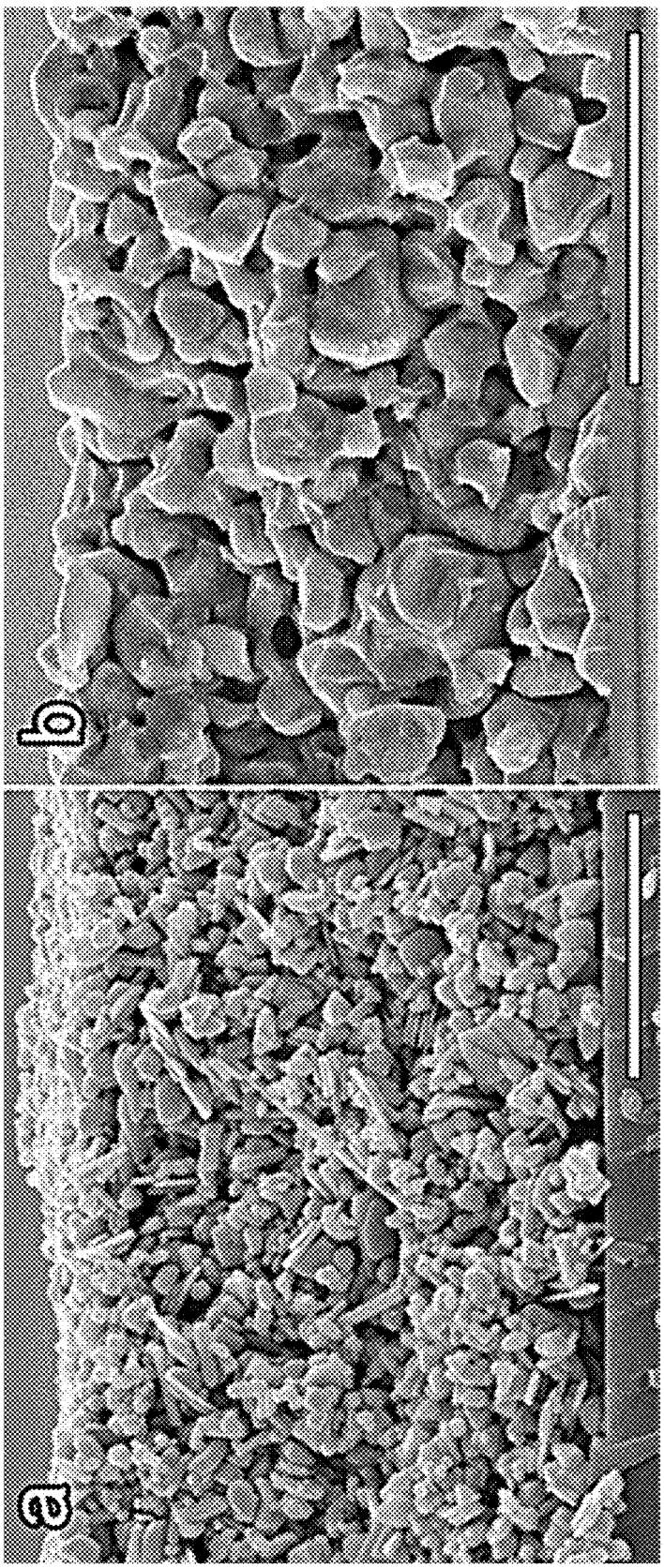
FIGS. 20A-20B shows a side-view SEM image of the $Cu_3(As_{0.5},Sb_{0.5})Se_4$ NP thin film on glass (20A) before annealing and (20B) after annealing in selenium atmosphere at 340° C. for 30 min. Significant grain growth and densification/necking is observed. Scale bars are 3 µm.

FIGS. 20A and 20B Side-view scanning electron microscopy image of $Cu_3(As_{0.5}, Sb_{0.5})Se_4$ nanoparticles drop cast on glass (20a) before and (20b) after calcining or annealing in selenium atmosphere at 340° C. for 30 min.

Figure 21:
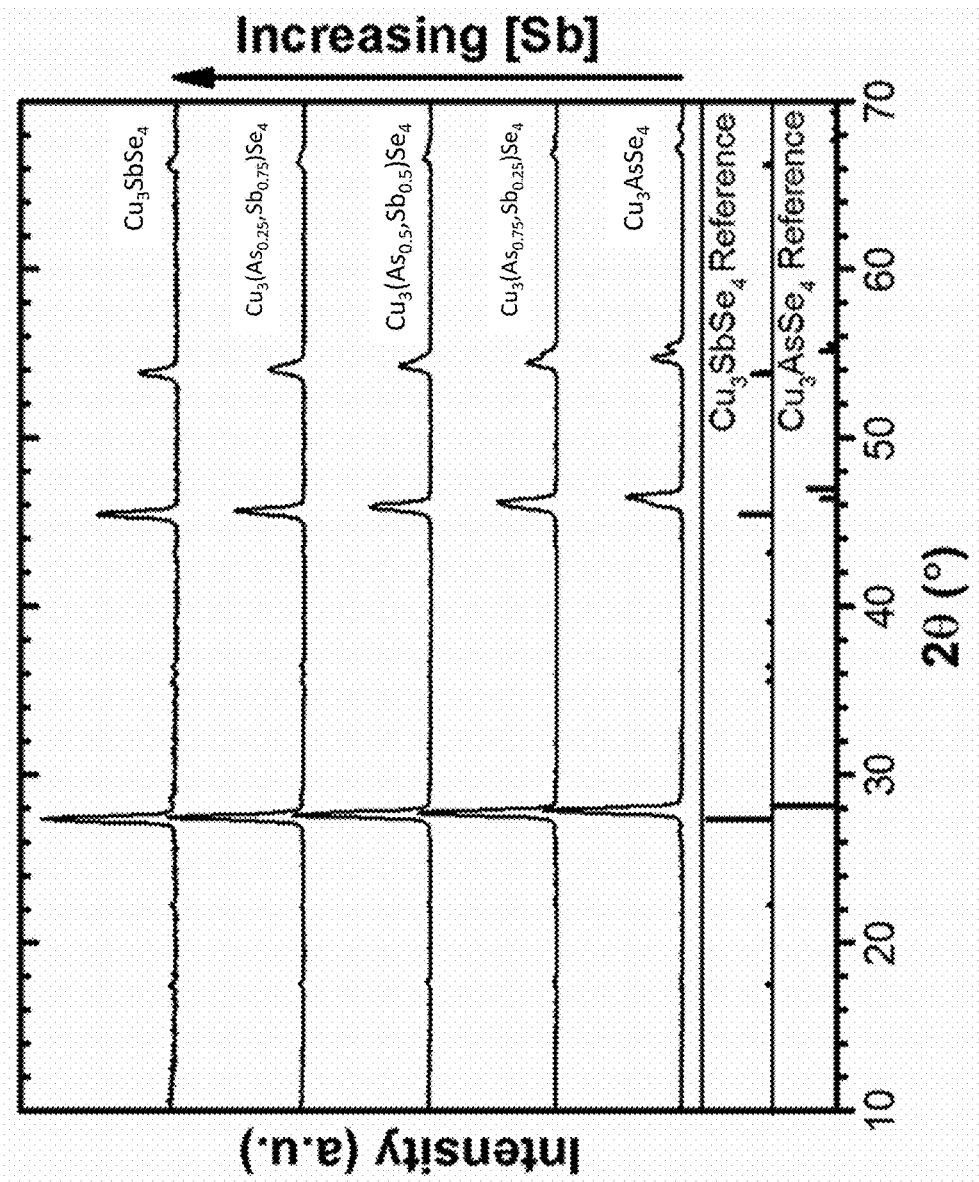
FIG. 21 shows XRD patterns post annealing in selenium atmosphere at 340° C. for 30 min showing no change in phase purity. (a) $Cu_3SbSe_4$, (b) $Cu_3(As_{0.25},Sb_{0.75})Se_4$, (c) $Cu_3(As_{0.5},Sb_{0.5})Se_4$, (d) $Cu_3(As_{0.75},Sb_{0.25})Se_4$, and (e) $Cu_3AsSe_4$. No impurity phases are observed.

FIG. 21. Post selenium calcining or annealing X-ray diffraction patterns of: (a) $Cu_3SbSe_4$, (b) $Cu_3(As_{0.25}Sb_{0.75})Se_4$, (c) $Cu_3(As_{0.5}Sb_{0.5})Se_4$, (d) $Cu_3(As_{0.75}Sb_{0.25})Se_4$ and (e) $Cu_3AsSe_4$.

Figure 22:
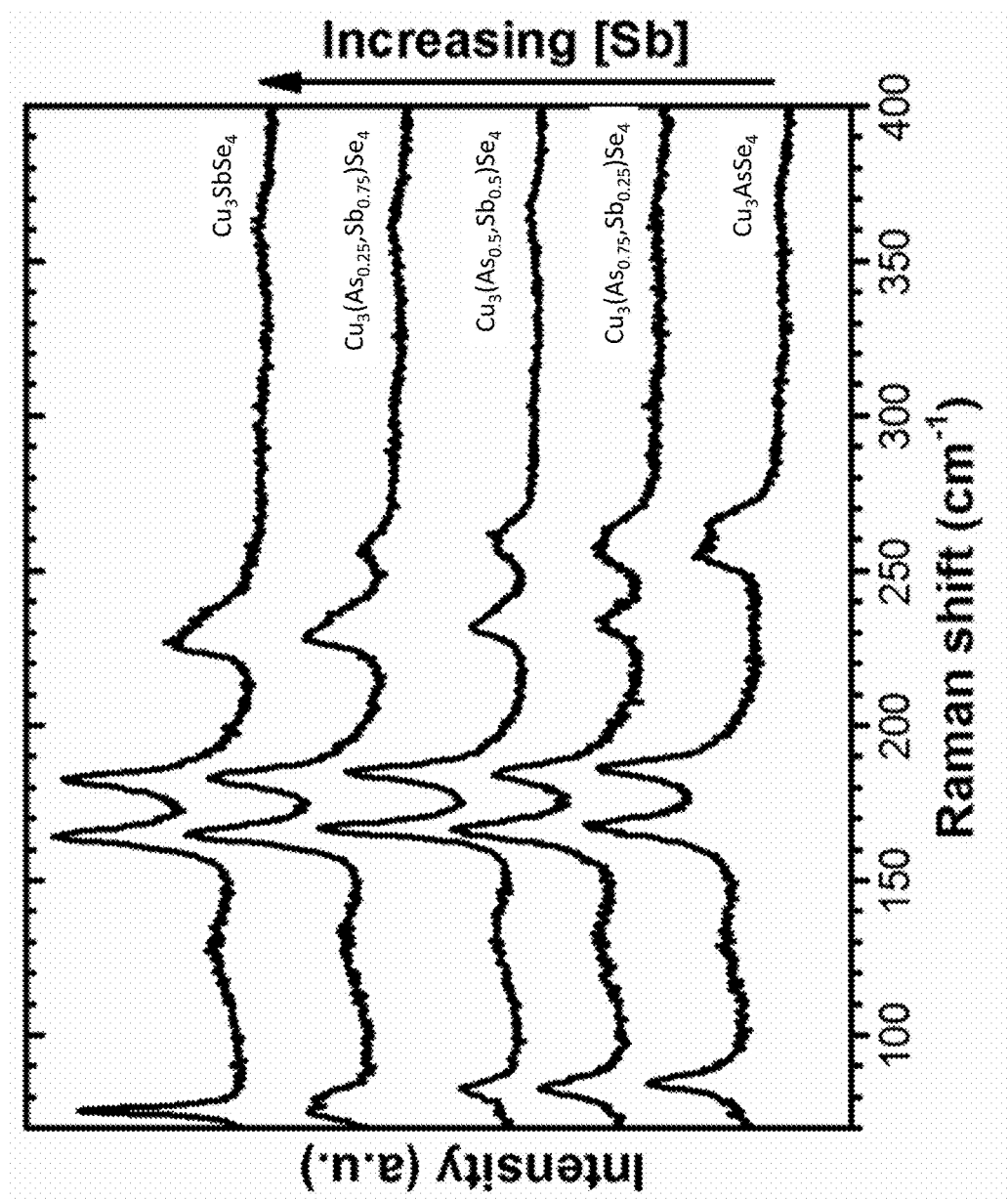
FIG. 22 shows Raman spectra post annealing in selenium atmosphere at 340° C. for 30 min showing no change in phase purity. (a) $Cu_3SbSe_4$, (b) $Cu_3(As_{0.25},Sb_{0.75})Se_4$, (c) $Cu_3(As_{0.5},Sb_{0.5})Se_4$, (d) $Cu_3(As_{0.75},Sb_{0.25})Se_4$, and (e) $Cu_3AsSe_4$. No impurity phases are observed.

FIG. 22. Post selenium calcining or annealing Raman spectra of: (a) $Cu_3SbSe_4$, (b) $Cu_3(As_{0.25}Sb_{0.75})Se_4$, (c) $Cu_3(As_{0.5},Sb_{0.5})Se_4$, (d) $Cu_3(As_{0.75}Sb_{0.25})Se_4$ and (e) $Cu_3AsSe_4$.

FIG. 23. SEM-EDS bulk elemental analysis of the CAS derived NPs after calcining or annealing in selenium at 340° C. for 30 min showing minimal changes in stoichiometry.

Calcining or annealing in Se leads to grain growth as shown in FIG. 20 and as seen from FIGS. 21-23, the CAS material is remarkably stable under Se calcining or annealing and preserves crystal structure and its composition; whereas in similar conditions under inert environments such as argon or nitrogen or in air, decomposition products are observed.

Example 7

Coating Techniques

CAS derived NPs were suspended in toluene (about 100 mg/mL) and drop cast onto glass. The substrate was covered and air dried for 12 hours. The resulting films provide a smooth, uniform, and dense film.

CAS derived NPs were suspended in toluene (about 10 mg/mL) and spray coated onto molybdenum coated soda lime glass using a home built motorized x-y stage with an ultrasonic spray nozzle. The substrate was preheated to 100° C. before coating to facillitate adherence of the coating. Six passes were performed yielding film thickness ~1 μm.

Figure 24:
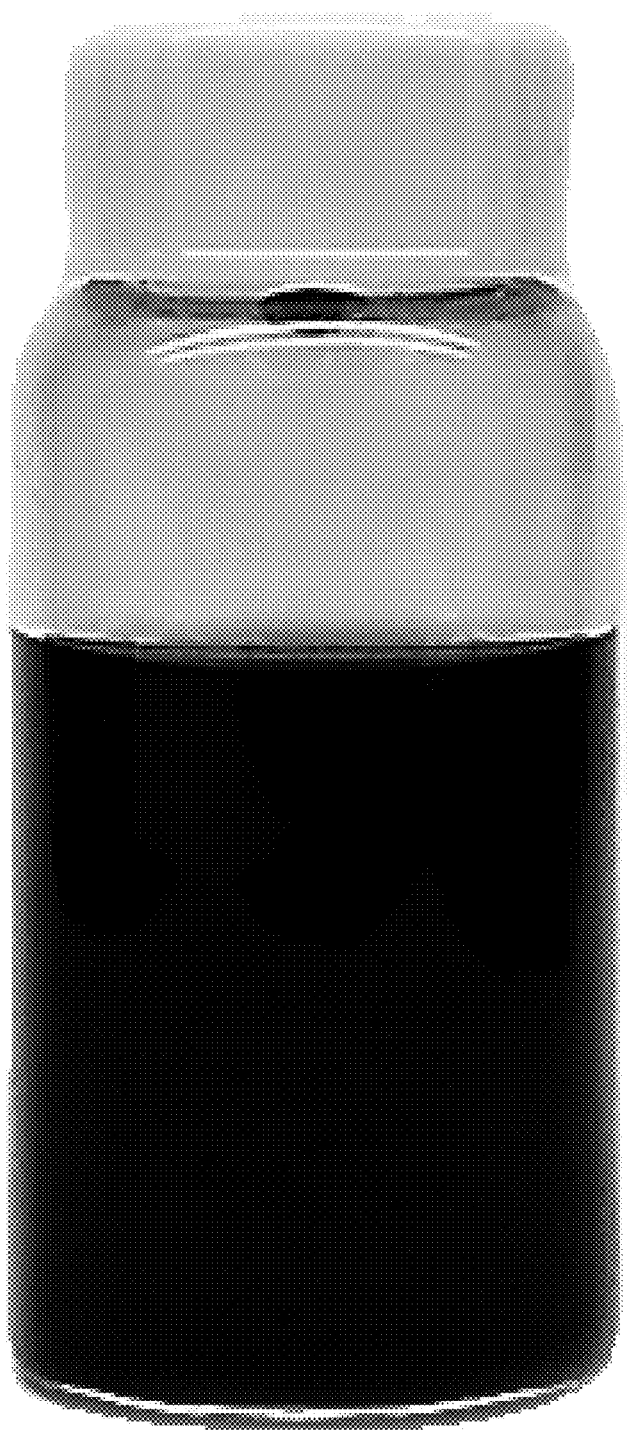
FIG. 24 are photographs of CAS derived NPs forming a colloidal suspension in toluene.

FIG. 24. Photograph of CAS derived NPs suspended in toluene (~100 mg/mL) forming a stable colloid.

Figure 25:
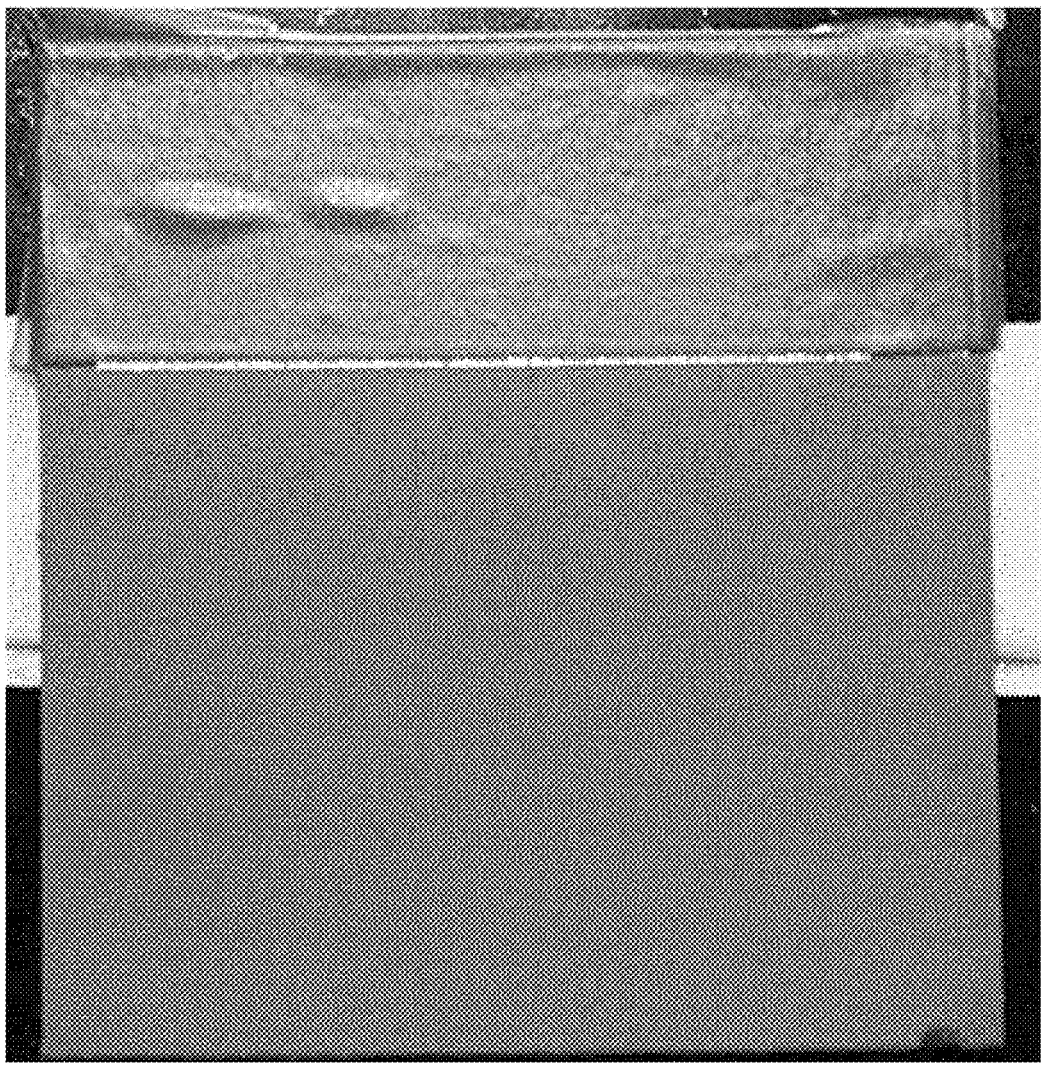
FIG. 25 is a photograph of CAS derived NPs suspended in toluene and spray coated onto molybdenum coated glass substrate.

FIG. 25. Photograph of CAS derived NPs suspended in toluene and spray coated according to Example 7 above onto molybdenum coated soda lime glass.

Example 8

Chalcogen Exchange Annealing

The sulfide $Cu_3(As,Sb)S_4$ NPs were drop cast onto glass substrate and annealed under selenium atmosphere according to Example 6 except at a temperature of 300° C. and for 90 min.

Figure 26:
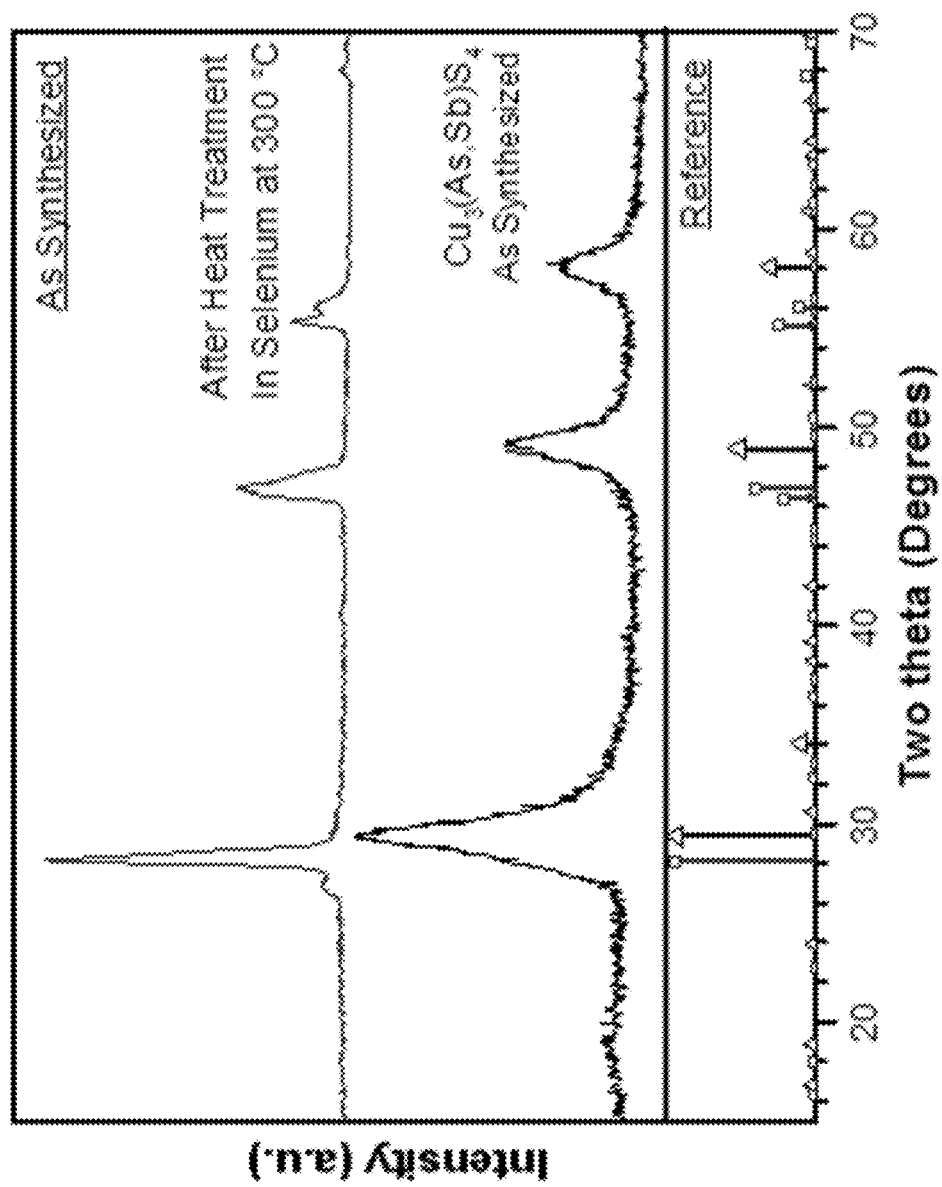
FIG. 26 show X-ray diffraction patters of chalcogen exchange reaction in a selenium atmosphere from $Cu_3(As,Sb)S_4$ to $Cu_3(As,Sb)Se_4$.

FIG. 26. XRD patterns of before and after calcining or annealing the $Cu_3(As,Sb)S_4$ samples in the presence of selenium. After calcining or annealing, the XRD pattern closely matches $Cu_3(As,Sb)Se_4$ demonstrating successful chalcogen exchange between the sulfur in the lattice with the selenium in the surrounding atmosphere during calcining or annealing.

Those skilled in the art will recognize that numerous modifications can be made to the specific implementations described above. The implementations should not be limited to the particular limitations described. Other implementations may be possible.

While the novel technology has been illustrated and described in detail in the drawings and foregoing description, the same is to be considered as illustrative and not restrictive in character. It is understood that the embodiments have been shown and described in the foregoing specification in satisfaction of the best mode and enablement requirements. It is understood that one of ordinary skill in the art could readily make a nigh-infinite number of insubstantial changes and modifications to the above-described embodiments and that it would be impractical to attempt to describe all such embodiment variations in the present specification. Accordingly, it is understood that all changes and modifications that come within the spirit of the novel technology are desired to be protected.

The invention claimed is:

1. A method for obtaining copper arsenic chalcogen derived nanoparticles, comprising:
   selecting a first precursor material from the group consisting of copper, arsenic, antimony, bismuth, and mixtures thereof, wherein the first precursor includes arsenic and copper;
   selecting a second material from the group consisting of sulfur, selenium, tellurium, and mixtures thereof; and
   reacting both precursors in a solvent medium at conditions conducive to the formation of copper arsenic chalcogen derived nanoparticles;
   wherein the copper arsenic chalcogen derived nanoparticles have a molecular formula denoted by $Cu_3(P_w As_x Sb_y Bi_z)(O_s S_t Se_u Te_v)_{4-r}$; wherein $w+x+y+z=1$; wherein $0<x<1$; wherein $0\leq w<1$; wherein $0\leq y<1$; wherein $0\leq z<1$; wherein $s+t+u+v=1$; wherein $0\leq s\leq 1$; wherein $0\leq t\leq 1$; wherein $0\leq u\leq 1$; wherein $0\leq v\leq 1$; wherein $-1.25\leq r\leq 1.25$; wherein $Cu/(P+As+Sb+Bi)=X_1$; wherein $(O+S+Se+Te)/(Cu+P+As+Sb+Bi)=X_2$; wherein $2.1\leq X_1\leq 3.8$; and wherein $0.6\leq X_2\leq 1.32$.

2. A method of producing a nanoporous thin film, comprising:

a) dispersing a quantity of copper arsenic chalcogen nanoparticles in a liquid medium to yield an ink;
b) applying the ink onto a substrate;
c) depositing a layer of nanoparticles onto the substrate; and
d) sintering the layer of nanoparticles to yield a nanoporous thin film.

3. The method of claim 2 and further comprising:
e) before a), selecting a first precursor material from the group consisting of copper, arsenic, antimony, bismuth, and mixtures thereof, wherein the first precursor includes copper and arsenic;
f) before a), selecting a second material from the group consisting of sulfur, selenium, tellurium, and mixtures thereof;
g) after f) and before a), reacting both precursors in a solvent medium at conditions conducive to the formation of copper arsenic chalcogen derived nanoparticles;
h) after e) and before a), suspending the first precursor material in a first solvent to yield a first precursor solution;
i) after f) and before a) suspending the second precursor material in a second solvent to yield a second precursor solution; and
j) after e) and f), and before a), combining the first and second precursor solutions to yield a reaction mixture; and
k) after j) and before a), heating the reaction mixture to a temperature between 100° C. and 411° C. to yield a quantity of copper arsenic chalcogen nanoparticles;
l) after k) and before a), collecting a quantity of copper arsenic chalcogen nanoparticles.

4. The method of claim 3 wherein the first and second solvent are the same.

5. The method of claim 2 wherein step d) is performed in a chalcogen atmosphere at temperatures between 150° C. and 650° C.

6. The method of claim 2, wherein the copper arsenic chalcogen derived nanoparticles have a molecular formula denoted by $Cu_3(P_w As_x Sb_y Bi_z)(O_s S_t Se_u Te_v)_{4-r}$; wherein $w+x+y+z=1$; wherein $0<x<1$; wherein $0\leq w<1$; wherein $0\leq y<1$; wherein $0\leq z<1$; wherein $s+t+u+v=1$; wherein $0\leq s\leq 1$; wherein $0\leq t\leq 1$; wherein $0\leq u\leq 1$; wherein $0\leq v\leq 1$; wherein $-1.25\leq r\leq 1.25$; wherein $Cu/(P+As+Sb+Bi)=X1$; wherein $(O+S+Se+Te)/(Cu+P+As+Sb+Bi)=X2$; wherein $2.1\leq X1\leq 3.8$; and wherein $0.6\leq X2\leq 1.32$.

7. The method of claim 2 wherein the nanoparticle ink comprises a mixture of at least two different pluralities of copper arsenic chalcogen nanoparticles of different compositions.

8. A thermoelectric device, comprising:
a substrate; and
a thin nanoporous contiguous layer adhered to the substrate;
wherein the thin nanoporous contiguous layer is a copper arsenic chalcogen material having a composition of $Cu_3(P_w As_x Sb_y Bi_z)(O_s S_t Se_u Te_v)_{4-r}$;
wherein $w+x+y+z=1$;
wherein $0<x<1$;
wherein $0\leq w<1$;
wherein $0\leq y<1$;
wherein $0\leq z<1$;
wherein $s+t+u+v=1$;
wherein $0\leq s\leq 1$;
wherein $0\leq t\leq 1$;
wherein $0\leq u\leq 1$;
wherein $0\leq v\leq 1$;

wherein $-1.25 \leq r \leq 1.25$;
wherein $Cu/(P+As+Sb+Bi)=X1$;
wherein $(O+S+Se+Te)/(Cu+P+As+Sb+Bi)=X2$;
wherein $2.1 \leq X1 \leq 3.8$; and
wherein $0.6 \leq X2 \leq 1.32$.

9. The device according to claim 8 wherein the composition is $Cu_3(As_x Sb_y)Se_4$; wherein $x+y=1$; and wherein $0.5 \leq x$.

\* \* \* \* \*